(12) United States Patent
Gyllenhammer et al.

(10) Patent No.: US 8,111,533 B2
(45) Date of Patent: Feb. 7, 2012

(54) SYSTEM FOR DYNAMICALLY MANAGING POWER CONSUMPTION IN A SEARCH ENGINE

(75) Inventors: Carl Gyllenhammer, Scotts Valley, CA (US); Greg Watson, Palo Alto, CA (US); Venkat Gaddam, Sunnyvale, CA (US); Varadarajan Srinivasan, Los Altos Hills, CA (US); Sandeep Khanna, Los Altos, CA (US); Chetan Deshpande, San Jose, CA (US)

(73) Assignee: NetLogic Microsystems, Inc., Santa Clara, CA (US)

( * ) Notice: Subject to any disclaimer, the term of this patent is extended or adjusted under 35 U.S.C. 154(b) by 0 days.

(21) Appl. No.: 13/190,179

(22) Filed: Jul. 25, 2011

(65) Prior Publication Data
US 2011/0317462 A1 Dec. 29, 2011

Related U.S. Application Data

(63) Continuation of application No. 12/822,073, filed on Jun. 23, 2010, now Pat. No. 8,031,503.

(51) Int. Cl.
*G11C 15/00* (2006.01)

(52) U.S. Cl. .................. 365/49.18; 365/49.17; 365/49.1

(58) Field of Classification Search ............... 365/49.18, 365/49.17, 49.1
See application file for complete search history.

(56) References Cited

U.S. PATENT DOCUMENTS

| | | | |
|---|---|---|---|
| 6,324,087 B1 | 11/2001 | Pereira | |
| 6,763,425 B1 | 7/2004 | Pereira | |
| 7,346,000 B1 | 3/2008 | Srinivasan et al. | |
| 7,382,637 B1 * | 6/2008 | Rathnavelu et al. | ........ 365/49.17 |

* cited by examiner

*Primary Examiner* — Jason Lappas
(74) *Attorney, Agent, or Firm* — Mahamedi Paradice Kreisman LLP; William L. Paradice, III

(57) ABSTRACT

The power consumption of a search engine such as a CAM device is dynamically adjusted to prevent performance degradation and/or damage resulting from overheating. For some embodiments, the CAM device is continuously sampled to generate sampling signals indicating the number of active states and number of compare operations performed during each sampling period. The sampling signals are accumulated to generate an estimated device power profile, which is compared with reference values corresponding to predetermined power levels to generate a dynamic power control signal indicating predicted increases in the device's operating temperature resulting from its power consumption. The dynamic power control signal is then used to selectively reduce the input data rate of the CAM device, thereby reducing power consumption and allowing the device to cool.

34 Claims, 15 Drawing Sheets

401

402

SYSTEM FOR DYNAMICALLY MANAGING POWER CONSUMPTION IN A SEARCH ENGINE

CROSS-REFERENCE TO RELATED APPLICATION

This application is a continuation application and claims the benefit under 35 USC 120 of the commonly owned U.S. patent application Ser. No. 12/822,073 entitled "System For Dynamically Managing Power Consumption in a Search Engine" filed on Jun. 23, 2010 now U.S. Pat. No. 8,031,503, the entirety of which is incorporated by reference herein.

TECHNICAL FIELD

The present invention relates generally to integrated circuits and specifically to managing power consumption of integrated circuits.

BACKGROUND OF RELATED ART

Content addressable memory (CAM) devices are frequently used in network switching and routing applications to determine forwarding destinations for data packets, and are also used to provide more advanced network Quality of Service (QoS) functions such as traffic shaping, traffic policing, rate limiting, and so on. More recently, CAM devices have been deployed in network environments to implement intrusion detection systems and to perform deep packet inspection tasks. For example, a new class of CAM device has been developed that can perform complex regular expression search operations.

More specifically, a CAM device includes a CAM array having a plurality of CAM cells organized in a number of rows and columns. Each row of CAM cells, which can be used to store a CAM word, is coupled to a corresponding match line that indicates match results for the row. Each column of CAM cells is typically coupled to one or more data lines or data line pairs that can be used to drive data into a selected CAM row during write operations and/or for providing a search key to the CAM rows during compare operations. During a compare operation, the search key (e.g., the comparand word) is provided to the CAM array and compared with the CAM words stored therein. For each CAM word that matches the search key, a corresponding match line is asserted to indicate the match result, which is typically stored in a match latch associated with the matching CAM row. If one or more of the match lines are asserted, a match flag is asserted to indicate the match condition, and a priority encoder determines the match address or index of the highest priority matching (HPM) entry in the CAM array.

Advances in CAM architectures and semiconductor process technologies have significantly increased storage density and data throughput. However, as storage density and data throughput increase, so do power consumption and heat generation. Indeed, thermal constraints have emerged as a potentially limiting factor in achieving even greater storage densities and data speeds. In networking environments, numerous factors such as packet size and packet content can impact the performance and power consumption of CAM devices deployed therein. For example, the specific contents of a packet can influence both power consumption and data speeds, and therefore the power consumption associated with processing packets of the same size can differ based upon various content-specific processing requirements.

To avoid spikes in power consumption that can damage network components due to overheating, network architects typically design content search systems based upon a predicted worst-case combination of packet size and content processing needs, for example, by limiting maximum data speeds. However, limiting data speeds of network components in a static manner based upon rarely occurring worst-case scenarios undesirably degrades performance.

The power consumption of CAM devices tasked with network routing functions (e.g., address look-ups for performing next-hop functions) is relatively predictable because the search keys and configuration of the CAM device vary little, and therefore designing such systems for the worst-case scenario has been acceptable to prevent device overheating. However, the power consumption of more advanced CAM devices deployed in regular expression search operations is relatively unpredictable because the packet contents and configuration of the CAM device can vary significantly. For example, the advanced CAM device disclosed in U.S. Pat. No. 7,643,353, which is assigned to the assignee of the present disclosure, includes a CAM array having counters and a programmable interconnect structure (PRS) that allow for the storage and searching of complex regular expressions having various metacharacters, quantifiers, and/or character classes. More specifically, the PRS can be configured to selectively route the match signal from each CAM row as an input match signal to itself and/or to any number of other arbitrary selected CAM rows and counter circuits at the same time, and allows the CAM array to store and implement non-deterministic finite automaton (NFA) that embody the complex regular expressions. Thus, the power consumption of such CAM devices depends not only upon the specific configuration of the PRS but also upon the sequence of input characters provided to the CAM array because of the capacitive loading associated with the PRS and the various match lines it may activate during search operations. As a result, conventional approaches to avoid device overheating that use static predictions of a worst-case scenario are insufficient to effectively balance performance and power consumption of such advanced CAM devices.

Accordingly, there is a need to improve the manner in which power consumption of CAM devices is managed.

BRIEF DESCRIPTION OF THE DRAWINGS

The present embodiments are illustrated by way of example and not intended to be limited by the figures of the accompanying drawings, where.

Like reference numerals refer to corresponding parts throughout the drawing figures.

DETAILED DESCRIPTION

A method and apparatus for dynamically managing and adjusting the power consumption of search engines are described below in the context of CAM devices. However, present embodiments are equally applicable for dynamically managing and adjusting power consumption in other types of search engines and IC devices. In the following description, for purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be a single signal line, and each of the single signal lines may alternatively be a bus. Further, the logic levels assigned to various signals in the description below are arbitrary, and therefore may be modified (e.g., reversed polarity) as desired. As used herein, the term "match signals" refers to signals generated on the match lines of a CAM array during compare operations that indicate the match results of corresponding rows of the CAM array. The match signals are sometimes referred to as match states or state information, and thus the terms "match signals," "match states," and "state information" are interchangeable in the following description. Accordingly, the present embodiments are not to be construed as limited to specific examples described herein but rather includes within its scope all embodiments defined by the appended claims.

Present embodiments dynamically adjust the power consumption of a search engine such as a CAM device to prevent performance degradation and/or damage resulting from overheating. For some embodiments, the state information and compare information generated in the CAM device is continuously sampled during normal device operation to generate sampling signals indicating the number of active states and the number of compare operations performed during each of a plurality of sampling periods. The sampling signals are then accumulated over a period of time to generate an estimated device power profile, which is then compared with one or more reference values corresponding to various predetermined power levels to generate a dynamic power control signal indicating predicted increases in the device's operating temperature resulting from its power consumption. The dynamic power control signal is then used to selectively reduce the input data rate of the CAM device, thereby reducing power consumption and allowing the operating temperature to decrease to an acceptable level that will not degrade performance or result in damage to the device.

Figure 1:
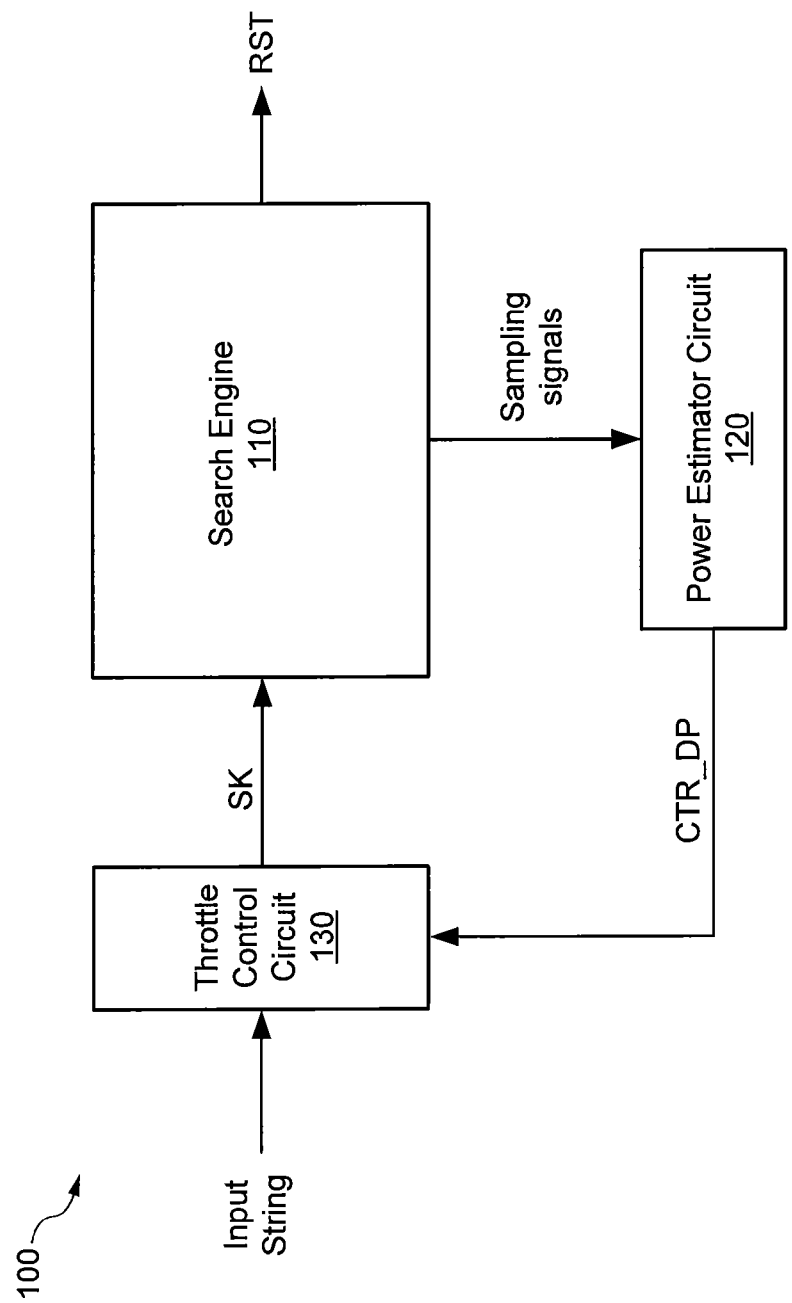
FIG. 1 is a functional block diagram of a search system in accordance with some of the present embodiments.

FIG. 1 shows a search system 100 within which the present embodiments may be implemented. Search system 100 includes a search engine 110, a power estimator circuit 120, and a throttle control circuit 130. Search engine 110 compares an input string with a number of stored patterns to generate a match results (RST). Further, in accordance with present embodiments, search engine 110 includes a sampling circuit (not shown in FIG. 1 for simplicity) that generates sampling signals representative of the power consumption of the search engine. For some embodiments, the sampling signals indicate how many active states are generated during a sampling period and/or indicate the number of compare operations performed in the search engine 110 during the sampling period. For other embodiments, the sampling signals may also include other operational characteristics of the search engine 110.

The power estimator circuit 120 includes an input to receive the sampling signals from search engine 110, and in response thereto generates a dynamic power control signal (CTR_DP) that is indicative of temperature increases resulting from a time-averaged power consumption of the search engine 110. For some embodiments, the power estimator circuit 120 accumulates the sampling signals provided by the search engine 110 to generate a moving average power profile of search engine 110 that can be used to predict temperature increases in search engine 110 resulting from its power consumption.

The throttle control circuit 130 has an input to receive an input string (e.g., incoming packets) from an input source (e.g., a blade or line card of a router or other network device), has an output to provide search keys (SK) extracted from the input string to search engine 110, and has a control port to receive the dynamic power control signal (CTR_DP) from the power estimator circuit 120. As explained in more detail below, throttle control circuit 130 selectively adjusts the rate at which the input string (e.g., search keys) are provided to search engine 110 in response to CTR_DP to dynamically adjust the power consumption of search engine 110. For example, when CTR_DP indicates that the search engine is consuming a sustained level of power that could result in damage due to overheating, throttle control circuit 130 can decrease the rate at which input data is provided to search engine 110 to decrease power consumption, thereby allowing the search engine to cool down to avoid overheating. Then, after power consumption levels have subsided long enough to decrease the operating temperature of search engine 110 to an acceptable (e.g., safe) level, throttle control circuit 130 can increase the input data rate to maximize performance.

In this manner, the throttle control circuit 130 can dynamically adjust the power consumption of search engine 110 by changing the input data rate of search engine 110 in response to a moving average power profile of the search engine, thereby allowing search engine 110 to operate at a maximum speed while the operating temperature is in a safe zone and allowing search engine 110 to operate at a reduced speed when the operating temperature begins approaching an unsafe zone. This is in marked contrast to prior power management techniques that shut down one or more portions (e.g., array blocks) of the search engine upon detecting an unacceptable increase in operating temperature.

For some embodiments, throttle control circuit 130 includes a plurality of first-in, first-out (FIFO) storage locations that store search keys waiting to be provided to search engine 130, and is configurable to adjust the input data rate of the search engine by altering (e.g., delaying) the rate at which the FIFO locations are enabled to output corresponding search keys to the search engine 110.

Figure 2:
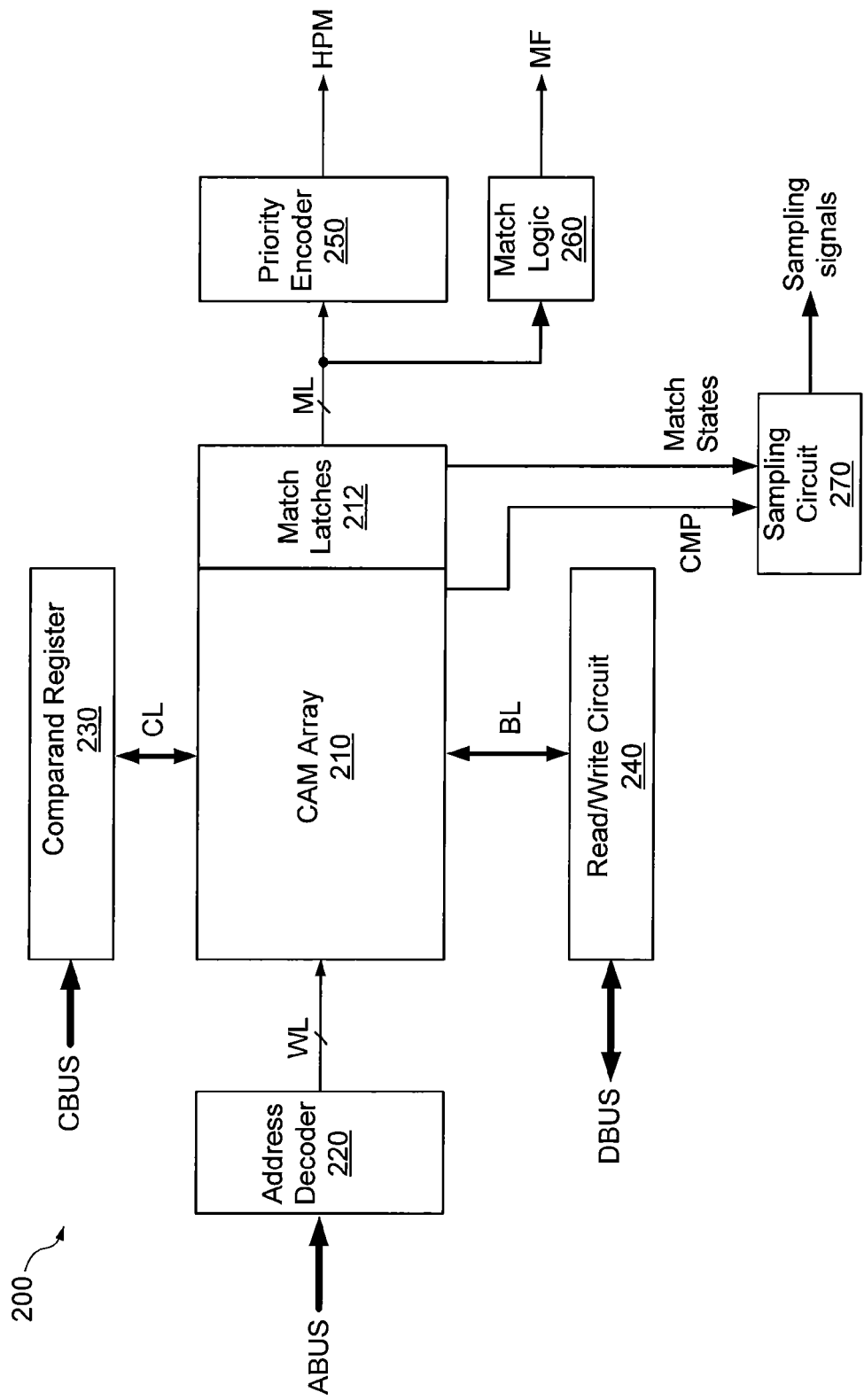
FIG. 2 is a functional block diagram of a content addressable memory (CAM) device in accordance with some embodiments of FIG. 1.

For exemplary embodiments described herein, search engine 110 is a CAM-based search engine, although for alternate embodiments other search engines may be used. For example, FIG. 2 shows a CAM device 200 that is one embodiment of search engine 110. CAM device 200 includes a CAM array 210, an address decoder 220, a comparand register 230, a read/write circuit 240, a priority encoder circuit 250, match logic 260, a sampling circuit 270, and a sampling control circuit 280. CAM array 210 includes any number of rows of CAM cells (not shown for simplicity in FIG. 2), where each row of CAM cells can be configured to store a data word. The CAM cells can be any suitable type of CAM cell including, for example, binary CAM cells, ternary CAM cells, and/or quaternary CAM cells. Further, while CAM array 210 is shown in FIG. 2 as a single CAM array, it may include any number of CAM array blocks that can be independently searched.

For some embodiments, CAM array 210 is of the type described in commonly-owned U.S. Pat. No. 7,643,353, which is incorporated by reference herein. For CAM arrays of the type described in U.S. Pat. No. 7,643,353, the rows of CAM cells are each selectively connected to a programmable routing structure (PRS) that can be configured to selectively route the match signal from any CAM row as an input match signal to itself and/or to any number of other arbitrarily selected CAM rows at the same time. The CAM array may also include a number of counter circuits that can be selectively connected to each other and/or to any number of the CAM rows by the PRS. In this manner, CAM arrays of the type disclosed in U.S. Pat. No. 7,643,353 can be configured to implement search operations for complex regular expressions having various metacharacters, quantifiers, and/or character classes.

More specifically, to store a complex regular expression in the CAM array disclosed in U.S. Pat. No. 7,643,353, the CAM array's PRS is programmed to implement a non-deterministic finite automaton (NFA) that embodies the complex regular expression, thereby mapping the NFA into the CAM array hardware. During search operations, the logic states of the match lines are indicative of the states of the corresponding NFA (e.g., where an asserted match line indicates that the corresponding state of the NFA is active, and a de-asserted match line indicates that the corresponding state of the NFA is inactive). In this manner, the match results stored in the CAM array's match latches can be used to indicate whether corresponding states of the NFA are active or inactive, thereby providing current state information for the NFA during search operations.

One or more instructions and related control signals may be provided to CAM device 200 from an instruction decoder (not shown for simplicity) to control read, write, compare, and other operations for CAM device 200. Other well-known signals that can be provided to CAM device 200, such as enable signals, clock signals, and power connections, are not shown for simplicity. Further, although not shown in FIG. 2, each row of CAM cells in CAM array 210 may have one or more validity bits to indicate whether the corresponding row (or any segment thereof) of CAM cells stores valid data. In addition, for some embodiments, the rows in CAM array 210 can be divided into a plurality of row segments, for example, to reduce the capacitive loading for each row or to provide multiple width/depth configurations for the array.

Each row of CAM cells (not shown in FIG. 2 for simplicity) in CAM array 210 is coupled to address decoder 220 via a corresponding word line WL, and to priority encoder 250 and match logic 260 via a corresponding match line ML. For simplicity, the word lines and match lines are represented collectively in FIG. 2. Address decoder 220 is well-known, and includes circuitry to select corresponding rows in CAM array 210 for read, write, and/or other operations in response to an address received from an address bus ABUS using the word lines WL. For other embodiments, addresses may be provided to address decoder 220 from another suitable bus and/or circuitry.

The match lines ML provide match results for compare operations between comparand data (e.g., a search key) and data stored in CAM array 210. Priority encoder 250, which is well-known, uses the match results indicated on the match lines to determine the matching entry that has the highest priority number associated with it and generates the index or address of this highest priority match (HPM). In addition, priority encoder 250 may use the validity bits from CAM array 210 to generate the next free address that is available in CAM array 210 for storing new data. Although not shown in FIG. 2, for some embodiments, priority encoder 250 may provide the next free address to the address decoder 220.

Match logic 260, which is well-known, uses the match results indicated on the match lines to generate a match flag (MF) indicative of a match condition in CAM array 210. If there is more than one matching entry in CAM array 210, match logic 260 may generate a multiple match flag to indicate a multiple match condition. In addition, match logic 260 may use the validity bits from CAM array 210 to assert a full flag when all of the rows of CAM cells in CAM array 210 are filled with valid entries.

Each column of CAM cells (not shown in FIG. 2 for simplicity) in CAM array 210 is coupled to comparand register 230 via one or more corresponding comparand lines CL, and is coupled to read/write circuit 240 via one or more corresponding bit lines BL. For simplicity, the comparand lines CL and bit lines BL are represented collectively in FIG. 2. Comparand register 230 is well-known, and is configured to provide a search key (e.g., a comparand word) received from a comparand bus CBUS to CAM array 210 during compare operations with data stored therein. For other embodiments, the search key can be provided to CAM array 210 via another bus and/or circuit. Read/write circuit 240 includes well-known write drivers to write data received from a data bus DBUS to CAM array 210 via the bit lines, and includes well-known sense amplifiers to read data from CAM array 210 onto DBUS. For other embodiments, read/write circuit 240 may be coupled to a bus other than DBUS. Further, although not shown in FIG. 2 for simplicity, CAM device 200 can include a well-known global mask circuit (e.g., coupled to the comparand register 230) that can selectively mask the bits of the search key provided to the CAM array 210.

CAM array 210 also includes a plurality of match latches 212. Each match latch 212 is coupled to the match line ML of a corresponding row of CAM cells, and is used to store the match signal or state of the corresponding CAM row during compare operations. For embodiments of CAM array 210 configured according to U.S. Pat. No. 7,643,353, the match states stored in the match latches 212 are indicative of corresponding states of the NFA(s) embodied by data stored in CAM array 210. In this manner, the match state information stored in the match latches 212 can be used to indicate whether each state of the NFA is active or inactive.

Sampling circuit 270, which can be any suitable sampling circuit, is shown in FIG. 2 as having a first input to receive match signals (MS) from match latches 212, a second input to receive compare information (CMP) from CAM array 210, and an output to generate the sampling signals indicative of the power consumption of the CAM array 210. For the exemplary embodiment shown in FIG. 2, the sampling signals generated by sampling circuit 270 indicate how many active states are generated during a sampling period, and may indicate how many compare operations are performed during the sampling period. For one such embodiment, sampling circuit 270 includes a first counter circuit (not shown for simplicity) that counts the number of asserted match signals (e.g., the number of active states) reported from CAM array 210 during the sampling period, includes a second counter circuit (not shown for simplicity) that counts the number of compare operations performed during the sampling period, a third counter to count the number of clock cycles of the sampling period, and logic to combine the input data (e.g., number of active states, number of compare operations, and number of clock cycles of the sampling period) to generate the sampling signals.

The state information can be provided from the match latches 212 and/or CAM array 210 to sampling circuit 270 by any suitable circuit or using any suitable technique. For one embodiment, a suitable control circuit such as a state machine (not shown in FIG. 2 for simplicity) continuously scans the match latches 212 for the state information during normal operation of the CAM device (e.g., during compare operations performed by CAM array 210), and reports the scanned state information to sampling circuit 270. For another embodiment, the match latches 212 continuously output the state information stored therein to sampling circuit 270 during normal operation of the CAM device via dedicated signal lines or a bus, for example, as described below with respect to FIGS. 6A-6B. For yet another embodiment, the match latches 212 continuously output the state information stored therein to sampling circuit 270 during normal operation of the CAM device in parallel using dedicated read circuitry connected to the CAM array's bit lines, for example, as described below with respect to FIGS. 7-9.

The compare information (CMP) can be provided from the CAM array 210 to the sampling circuit 270 by any suitable circuit or technique. For one embodiment, comparand register 230 or another suitable circuit can provide compare enable signals (e.g., that enable compare operations to be performed in CAM array 210) as CMP to sampling circuit 270 during normal operation of the CAM device 200. For another embodiment, the comparand lines can be monitored to detect occurrence of each compare operation and report the resulting compare information to sampling circuit 270.

Figure 3:
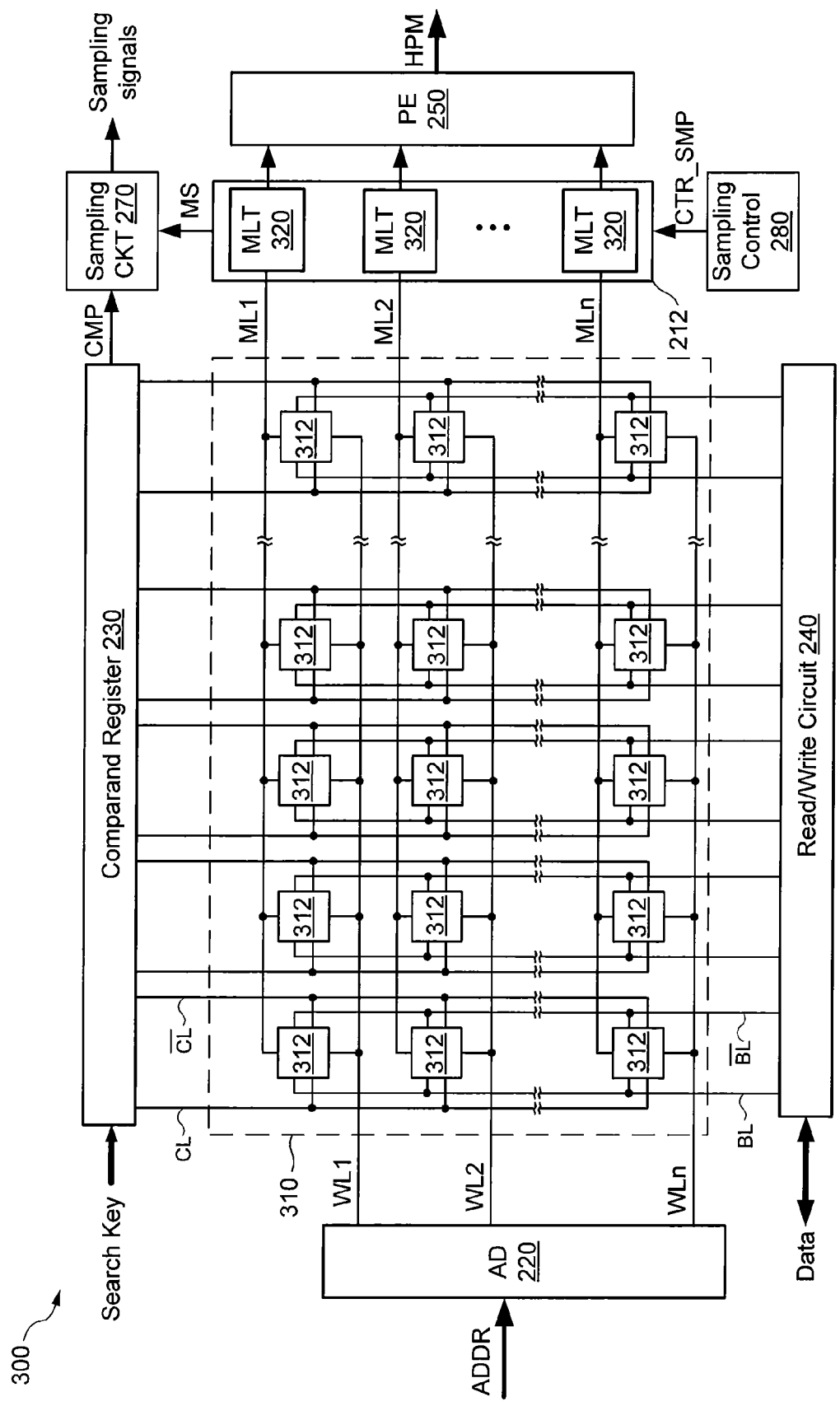
FIG. 3 is a block diagram of a portion of one embodiment of the CAM device of FIG. 2.

FIG. 3 shows a portion of a CAM device 300 that is one embodiment of the CAM device 200 of FIG. 2. CAM device 300 is shown to include a CAM array 310, comparand register 230, read/write circuit 240, priority encoder 250, sampling circuit 270, and a sampling control circuit 280. Other well-known components of CAM device 300 are not shown for simplicity. CAM array 310, which is one embodiment of CAM array 210 of FIG. 2, includes a plurality of CAM cells 312 arranged in a number of rows and columns, and includes a number of match latches 320(1)-320(n). Each row of CAM cells 312 is coupled to address decoder 220 via a corresponding word line WL, and is coupled to an associated match latch 320 via a corresponding match line ML. The word lines are selectively driven by address decoder 220 in response to an address (ADDR) to select one or more of rows of CAM cells 312 for writing or reading in a well-known manner. The match lines ML indicate match results of a compare operation performed in CAM array 310. The match latches 320, which can be any suitable register, latch, flip-flop, SRAM cell, DRAM cell, or other memory element, store the match results provided on the match lines ML, and are coupled to corresponding inputs of priority encoder 250. Although not shown for simplicity, for some embodiments, each match latch 320 can include a clock input to receive a match latch signal that causes the match latches 320 to latch the match signals provided on the match lines ML. Together, match latches 320 form one embodiment of match latches 212 of FIG. 2.

For exemplary embodiments described herein, the match lines ML are pre-charged to logic high (e.g., VDD) for compare operations, and if all CAM cells 312 in a row match the search key, the row's match line ML remains in its charged state to indicate the match condition. Conversely, if one or more CAM cell 312 in the row does not match the search key, those CAM cell(s) 312 discharge the match line ML toward ground potential (e.g., logic low) to indicate the mismatch condition.

Each column of CAM cells 312 is coupled to the comparand register 230 via a complementary comparand line pair CL/$\overline{CL}$, and to the read/write circuit 240 via a complementary bit line pair BL/$\overline{BL}$. The comparand register 230 includes a plurality of drivers (not shown for simplicity) that provide complementary comparand data to columns of CAM cells 312 during compare or search operations via the comparand line pairs CL/$\overline{CL}$. Although the comparand data present on a comparand line pair is generally referred to herein as being complementary comparand signals, a comparand line pair CL/$\overline{CL}$ may be driven to the same logic state (e.g., logic low or high) to mask compare operations within an entire column of the CAM array 310. The read/write circuit 240 provides/receives complementary CAM data to/from the columns of CAM cells 312 via the bit line pairs BL/$\overline{BL}$. More specifically, read/write circuit 240 includes a plurality of well-known sense amplifiers (not shown for simplicity) to read data read from the bit line pairs BL/$\overline{BL}$, and includes a plurality of well-known write drivers (not shown for simplicity) to write data into the CAM array 310 via the bit line pairs BL/$\overline{BL}$.

For other embodiments, the complementary comparand lines CL/$\overline{CL}$ may be replaced by single-ended comparand lines, and/or the complementary bit lines BL/$\overline{BL}$ may be replaced by single-ended bit lines. In addition, for other embodiments, the comparand lines can be omitted, and the bit lines can be used to provide comparand data to the CAM array for compare operations. For alternate embodiments, encoded comparand data can be provided to the CAM array for search operations, for example, as described in commonly-owned U.S. Pat. No. 7,133,312, which is incorporated by reference herein.

For the exemplary embodiment of FIG. 3, the sampling circuit 270 includes a first input to receive match states (MS) from the match latches 320, a second input to receive compare enable signals (CMP) from comparand register 230, and an output to generate the sampling signals. For some embodiments, the compare signal CMP is asserted upon commencement of each compare operation in CAM array 310. For another embodiment, CMP can be generated by another suitable circuit within and/or associated with CAM array 310.

Sampling control circuit 280 is coupled to match latches 320 and is configured to generate one or more sampling control signals CTR_SMP that cause state information stored in or associated with match latches 320 to be forwarded to sampling circuit 270 during normal operation (e.g., during compare operations) of CAM device 300. In this manner, the sampling control circuit 280 continuously scans the match latches for state information and reports the state information to sampling circuit 270 without disturbing or interfering with search operations in the CAM array. For some exemplary embodiments described herein, the state information for the entire CAM array is provided continuously at the same time to sampling circuit 270.

However, because of limited signal routing resources in CAM device 300, sampling control circuit 280 is, for some actual embodiments, configured to sequentially scan the state information associated with each of a plurality of row groups in a plurality of corresponding sampling periods. For such embodiments, the N rows CAM array 310 are grouped into P groups of M rows, where N=P*M. Then, during each of P sampling periods, the sampling control circuit 280 provides the state information for a selected group of M rows at the same time as the MS signals to corresponding inputs of the sampling circuit 270. In response thereto, sampling circuit 270 combines the number of active states detected in the selected group of rows, the number of compare operations performed during the sampling period, and the duration of the sampling period to generate the sampling signals for the corresponding row group. This process is then repeated for all the row groups, where the sampling control circuit 280 selects consecutive row groups during successive sampling periods.

For example, in one exemplary embodiment in which CAM array 310 includes 16k rows and the sampling circuit 270 is configured to receive state information for 128 rows at a time, the sampling control circuit 280 scans the state information for a selected group of 128 rows and sends the collected state information for the selected 128 rows to sampling circuit 270, which in turn generates the sampling signals for the corresponding row group. The sampling control circuit 280 then selects the next group of 128 rows, and this process is sequentially repeated for each of 16k/128=128 row groups. Thus, for this embodiment, the entire CAM array 310 can be scanned by control circuit 280 for state information in 128 sampling periods, with each sampling period providing state information for 128 CAM rows at a time to sampling circuit 270. Once all of the row groups of the CAM array 310 have been scanned, the sampling control circuit 280 begins scanning the first row group again. In this manner, the state information generated during search operations in CAM array 310 is continuously scanned 128 rows at a time. Note that the length of each sampling period may vary due to the time required to read the active states from a selected row group, and therefore the duration of each sampling period is, for some embodiments, measured in terms of a suitable clock signal (e.g., a system clock signal) for the CAM device 300.

Figure 4A:
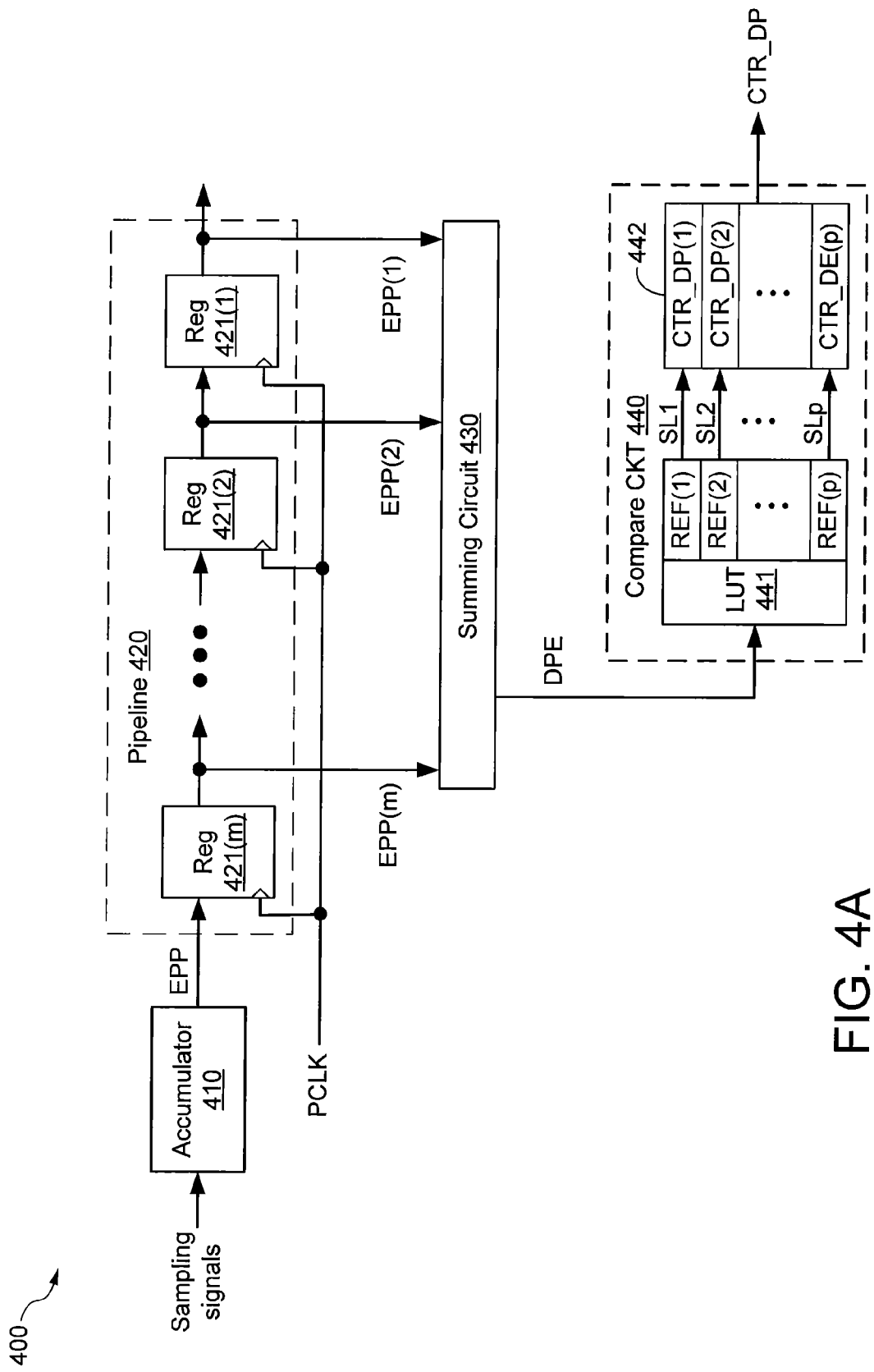
FIG. 4A is a block diagram of one embodiment of the power estimator circuit of FIG. 1.

FIG. 4A shows a power estimator circuit 400 that is one embodiment of the power estimator circuit 120 of FIG. 1. The power estimator circuit 400 includes an accumulator 410, a register pipeline 420, a summing circuit 430, and a compare circuit 440. Accumulator 410 includes an input to receive the sampling signals provided by sampling circuit 270, and logically combines the sampling signals to generate an estimated power profile (EPP) signal indicative of a time averaged power profile for the selected row group in the CAM array. For some embodiments, each EPP signal is derived according to the expression EPP=(S*C)/T, where S is the number of asserted match signals (or active states), C is the number of compare operations, and T is the time duration of the sampling period. For other embodiments, the EPP signal is derived using the expression EPP=C*(S+k))/T, where k is a constant indicative of the dynamic power that is consumed if no match signals are asserted. For some embodiments, accumulator 410 stores two EPP values: the completed EPP value for the previously selected row group of the CAM array, and the current EPP value being generated for the currently selected row group of the CAM array.

The register pipeline 420 includes a plurality of registers 421(1)-421(m) coupled in series, with the output of each register 421 coupled to the input of the next register 421 in the pipeline 420. The input of the first register 421(m) receives the EPP signal generated for a corresponding CAM row group by the accumulator 410. Registers 421 can be any suitable type of register, latch, or flip-flop, and each register 421 includes a clock input (<) to receive a pipeline clock signal PCLK. The succession of EPP signals generated by the accumulator 410 can be clocked into consecutive register stages 421 in response to triggering edges (e.g., either rising edges or falling edges) of PCLK so that the EPP signal output at each of register stages 421 corresponds to a different sampling period (e.g., and to a different row group of the CAM array). For example, after m cycles of PCLK, the first power signal EPP(1) appears at the output of register 421(1), the second power signal EPP(2) appears at the output of register 421(1), and the $m^{th}$ power signal EPP(m) appears at the output of register 421(m). In this manner, the register pipeline 420 stores a plurality of EPP signals that represent power consumption profiles for m sampling periods. The value of m can be any integer greater than one. For some embodiments, m=16.

The power signals EPP(1)-EPP(m) are provided from the outputs of corresponding registers 421(1)-421(m) to inputs of summing circuit 430, which in response thereto generates a dynamic power estimate (DPE) signal that is indicative of a time-averaged moving estimate of power consumption of the CAM device over m sampling periods. The DPE signal is provided as a search key or look-up value to compare circuit 440.

Compare circuit 440 includes a look-up table (LUT) 441 coupled to an associated memory element 442. LUT 441 includes an input to receive the DPE signal provided by summing circuit 430, and includes storage locations to store a plurality of reference signals REF(1)1-REF(p) that represent various predetermined power consumption reference values. Memory element 442, which can implemented using any suitable type of memory cells, includes storage locations to store a plurality of values of dynamic power throttle control (CTR_DP) signals, each of which indicates a corresponding decrease in the rate at which throttle control circuit 130 of FIG. 1 provides the input string search keys to search engine 110. The storage locations of memory element 442 are coupled to associated storage locations in LUT 441 by corresponding selects line SL.

In operation, LUT 441 compares the value of DPE received from summing circuit 430 with the reference signals REF(1) 1-REF(p) to identify which reference signal matches or most closely matches the value of DPE. For some embodiments, LUT 441 identifies all reference signals having values less than the value of the DPE signal, and then selects the greatest of the identified reference signals as the matching reference signal. For one such embodiment, LUT 441 can be implemented using CAM technology. The select line SL associated with the matching reference signal is then asserted to select a corresponding throttle control signal CTR_DP, which in turn is output from memory element 442 and provided as CTRL_DP to the throttle control circuit 130 of FIG. 1. In response to CTR_DP, throttle control circuit 130 adjusts the rate at which bytes of the input string are provided to search engine 110. By reducing the input data rate of search engine 110, the power consumption of search engine 110 is reduced, thereby allowing the operating temperature of search engine 110 to decrease and thus avoid damage resulting from overheating.

For some embodiments, the values of the throttle control signals CTR_DP are percentage values by which the input data rate of search engine 110 is to be reduced if the time-averaged power consumption indicated by DPE exceeds a corresponding value of the reference signals stored in the LUT 441. For one exemplary embodiment, memory element 442 stores 10 throttle control values, where the value of CTR_DP(1) is 10%, the value of CTR_DP(2) is 20%, value of CTR_DP(3) is 30%, and so on, where the value of a last signal CTR_DP(10) is 100%. For such an exemplary embodiment, the values of the corresponding 10 reference signals REF(1)-REF(10) stored in the compare circuit 441 also increase in value such that REF(1) is the lowest power profile reference value, REF(2) is the next lowest power profile reference value, and so on, where REF(10) is the highest power profile reference value, where each increasing power profile value indicates that power consumption of the search engine is creating a larger increase in operating temperature. Of course, for other embodiments, the reference signals REF and throttle values CTR_DP can be stored in descending order in compare circuit 441 and memory element 442, respectively.

For example, if the value of the DPE signal generated by summing circuit 430 is less than REF(1), which indicates that the power consumption of search engine 110 is within an acceptable range determined to not pose a threat of overheating, then there is no match found in LUT 441, and the input data rate of search engine 110 is not adjusted. If the value of the DPE signal is greater than REF(1) but less than REF(2), LUT 441 identifies REF(1) as the matching entry and asserts the corresponding select line SL1. In response thereto, memory element 442 outputs CTR_DP(1)=10% to throttle control circuit 130, which in turn decreases the input data rate of search engine 110 by 10%. Similarly, if the value of the DPE signal is greater than REF(2) but less than REF(3), LUT 441 identifies REF(2) as the matching entry and asserts the corresponding select line SL2. In response thereto, memory element 442 outputs CTR_DP(2)=20% to throttle control circuit 130, which in turn decreases the input data rate of search engine 110 by 20%. Lastly, if the value of the DPE signal is greater than REF(10), LUT 441 identifies REF(10) as the matching entry and asserts the corresponding select line SL10. In response thereto, memory element 442 outputs CTR_DP(10)=100% to throttle control circuit 130, which in turn halts the flow of input data to search engine 110.

The operation of the power management system described above continuously samples the state information and compare operations in the search engine, and therefore the power profile generator circuit 270 continuously provides a new EPP signal to power estimator circuit 400 after each sampling period. As a result, new values of EPP are continuously clocked through the register pipeline 420, and summing circuit 430 is continuously updating the value of DPE to reflect the dynamic nature of the power consumption by the search engine 110.

As described above, power estimator circuit 400 processes the sampling signals generated by sampling circuit 270 to generate a moving average of the power consumption of search engine 110 that can be used to predict temperature increases in search engine 110 resulting from its power consumption. For other embodiments, the power estimator circuit 120 can be configured to assign different weights to the EPP values provided to summing circuit 430 by register stages 421 in the pipeline 420, for example, to place a greater weight on more recent sampling signals than on less recent sampling signals.

Figure 4B:
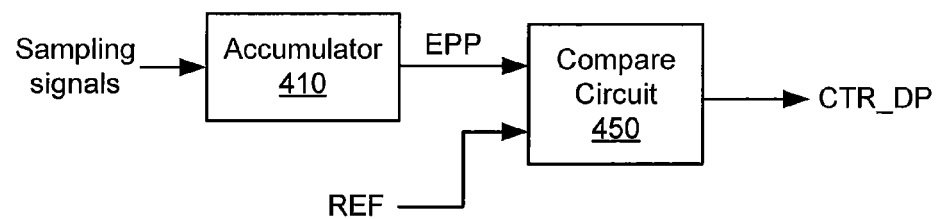
FIG. 4B is a block diagram of another embodiment of the power estimator circuit of FIG. 1.

FIG. 4B shows a power estimator circuit 401 that is another embodiment of the power estimator circuit 120 of FIG. 1. The power estimator circuit 401 includes accumulator 410 and a compare circuit 450. The operation of accumulator circuit 410 is similar to that described above with respect to FIG. 4A. Compare circuit 450 compares the value of EPP provided by accumulator 410 with a single reference value (REF) to generate the throttle control signal CTR_DP. The value of REF is selected to correspond to a level of power consumption that is likely to cause performance degradation or damage to the search system resulting from overheating. Thus, for the power estimator circuit 401, if the value of EPP is greater than REF, then CTR_DP is asserted and causes the throttle control circuit 130 of FIG. 1 to decrease the input data rate of the search engine 110 by a predetermined amount. Conversely, if the value of EPP is not greater than REF, then CTR_DP is de-asserted and the throttle control circuit 130 does not adjust the input data rate of the search engine 110. The power estimator circuit 401 of FIG. 4B is smaller and more simple than the power estimator circuit 400 of FIG. 4A, and thus occupies less silicon area and consumes less power, but provides less flexibility in dynamically adjusting the input data rate to the search engine in response to increases in operating temperature. As a result, the embodiment of FIG. 4B may be suitable for applications in which it desirable to decrease the input data rate by a predetermined amount as long as the estimated power consumption of the search engine exceeds the threshold indicated by REF.

Figure 4C:
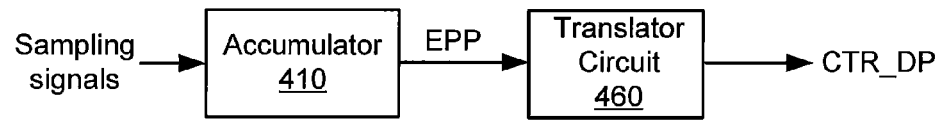
FIG. 4C is a block diagram of yet another embodiment of the power estimator circuit of FIG. 1.

FIG. 4C shows a power estimator circuit 402 that is another embodiment of the power estimator circuit 120 of FIG. 1. The power estimator circuit 402 includes accumulator 410 and a translator circuit 460. The operation of accumulator circuit 410 is similar to that described above with respect to FIG. 4A. Translator circuit 450 processes the value of EPP provided by accumulator 410 to generate a specific value of CTR_DP that indicates the amount by which the throttle control circuit 130 adjusts (e.g., either increases or decreases) the input data rate of search engine 110. For one embodiment, translator circuit 460 multiplies the EPP signal by a predetermined throttle factor to generate a value of CTR_DP that can be used to selectively decrease the input data rate of the search engine. Thus, for some embodiments, translator circuit 460 performs the functions of register pipeline 420, summing circuit 430, and compare circuit 440 of FIG. 4A.

Figure 5:
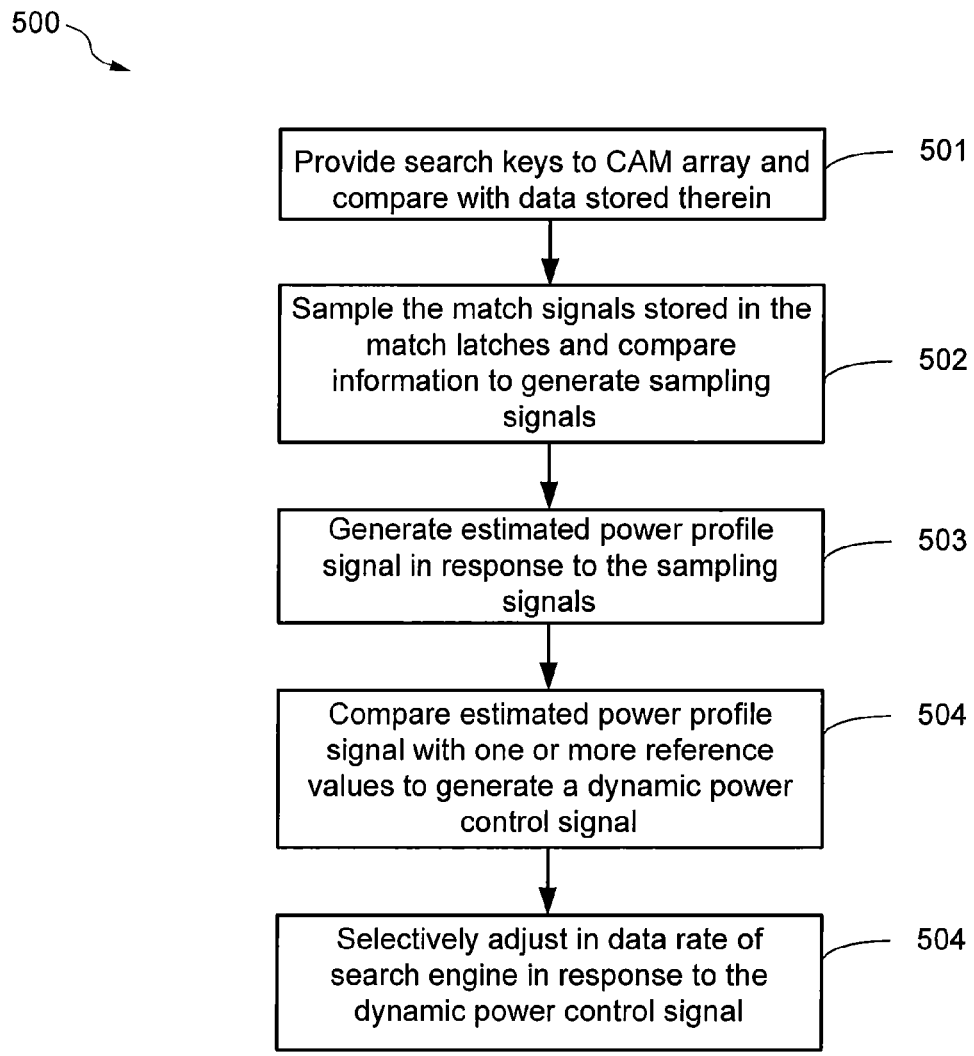
FIG. 5 is an illustrative flow chart depicting an exemplary power management operation in accordance with some embodiments.

A general operation of the exemplary embodiments of the search system depicted in FIGS. 1-3 is described below with respect to the illustrative flow chart of FIG. 5. First, search data (e.g., search keys constructed from the input) are provided to the search engine 110 by the throttle control circuit 130 and compared with data stored in the CAM array to generate match signals (501). As described above, the match signals, which can indicate whether corresponding states of an NFA implemented in the CAM array are active or inactive, are stored in the match latches 320. Then, sampling circuit 270 samples the match signals stored in the match latches and compare information to generate sampling signals indicating the number of active states (e.g., the number of asserted match signals), the number of compare operations performed, and the duration of the sampling period (502). For some embodiments, sampling control circuit 280 sequentially selects successive group of rows of the CAM array to be sampled by sampling circuit 270.

The power estimator circuit 130 uses the sampling signals to generate an estimated power profile signal that indicates a time averaged value of power consumption of the search engine (503), and then compares the estimated power profile signal with one or more reference signals to generate a dynamic power control signal (504). The reference signals correspond to different power profile values that are associated with various predicted increases in operating temperature. Then, the throttle control circuit 130 selectively adjusts the input data rate of the search engine in response to the dynamic power control signal to manage power consumption so that resulting operating temperature increases do not degrade performance and/or damage the search system (505). For example, if the dynamic power control signal indicates that the moving average of power consumption in the search engine, if unabated, is likely to cause an unacceptable increase in operating temperature, the throttle control circuit 130 decreases the input data rate of the search engine until the operating temperature decreases to an acceptable level.

Figure 6A:
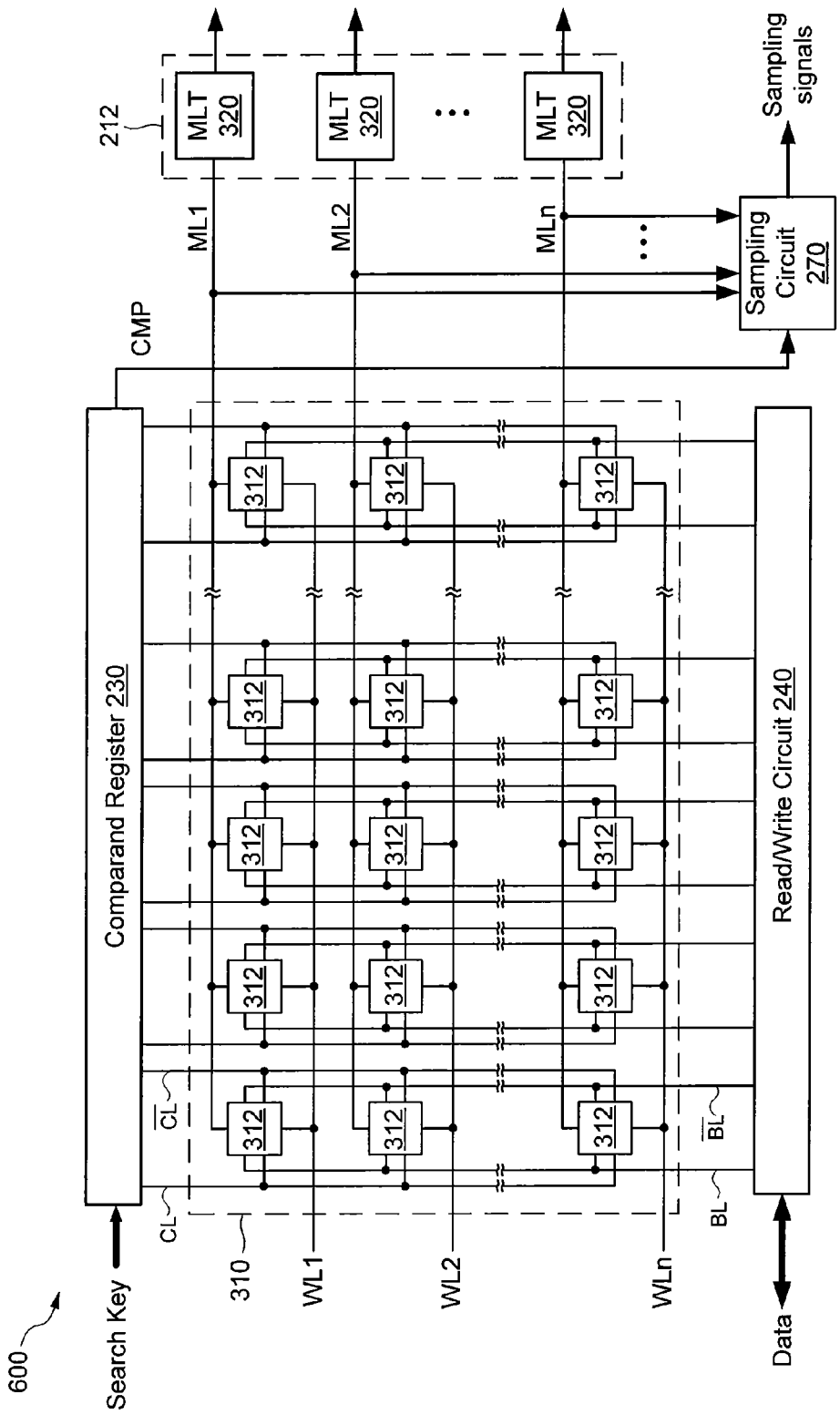
FIG. 6A is a block diagram of a portion of another embodiment of the CAM device of FIG. 2.

FIG. 6A shows CAM array 310 coupled to sampling circuit 270 in accordance with another embodiment. For the exemplary embodiment of FIG. 6A, each of match lines ML1-MLn is coupled to a corresponding input of a first port of sampling circuit 270 so that the match signals generated on the match lines during compare operations can be provided in parallel as match state information to sampling circuit 270, which as mentioned above includes a counter (not shown for simplicity) that counts the number of active states generated in the CAM array 310 during the sampling period. In addition, sampling circuit 270 includes a second input port to receive a compare signal (CMP) from comparand register 230. For some embodiments, the compare signal CMP is asserted upon commencement of each compare operation in CAM array 310, and an associated counter (not shown for simplicity) provided within sampling circuit 270 counts the number of times that CMP is asserted to determine how many compare operations were performed in the CAM array during the sampling period. For another embodiment, CMP can be generated by another suitable circuit within and/or associated with CAM array 310.

Although able to provide the match results from all N rows of the CAM array to sampling circuit 270 at the same time, the exemplary embodiment depicted in FIG. 6A requires a signal line and input to sampling circuit 270 for each row of the CAM array, which undesirably consumes a significant amount of valuable silicon area. Thus, for actual embodiments, sampling circuit 270 includes a predetermined number M of inputs that are selectively coupled to one of P groups of M rows at a time by a suitable control circuit, where M=N/P. For simplicity, the control circuit, which can be a state machine, multiplexer, or other suitable control circuitry, is not shown in FIG. 6A. In this manner, the control circuit sequentially scans each of the P group of M rows for state information and sends the collected state information for the selected group of M rows to sampling circuit 270 during one of P sampling periods. In response thereto, sampling circuit 270 combines the number of active states detected in the selected group of rows with the number of compare operations performed and the duration of the sampling period to generate a sampling signal for the selected row group. This process is then sequentially repeated for the remaining row groups, where the sampling circuit 270 generates a sampling signal for each row group.

Figure 6B:
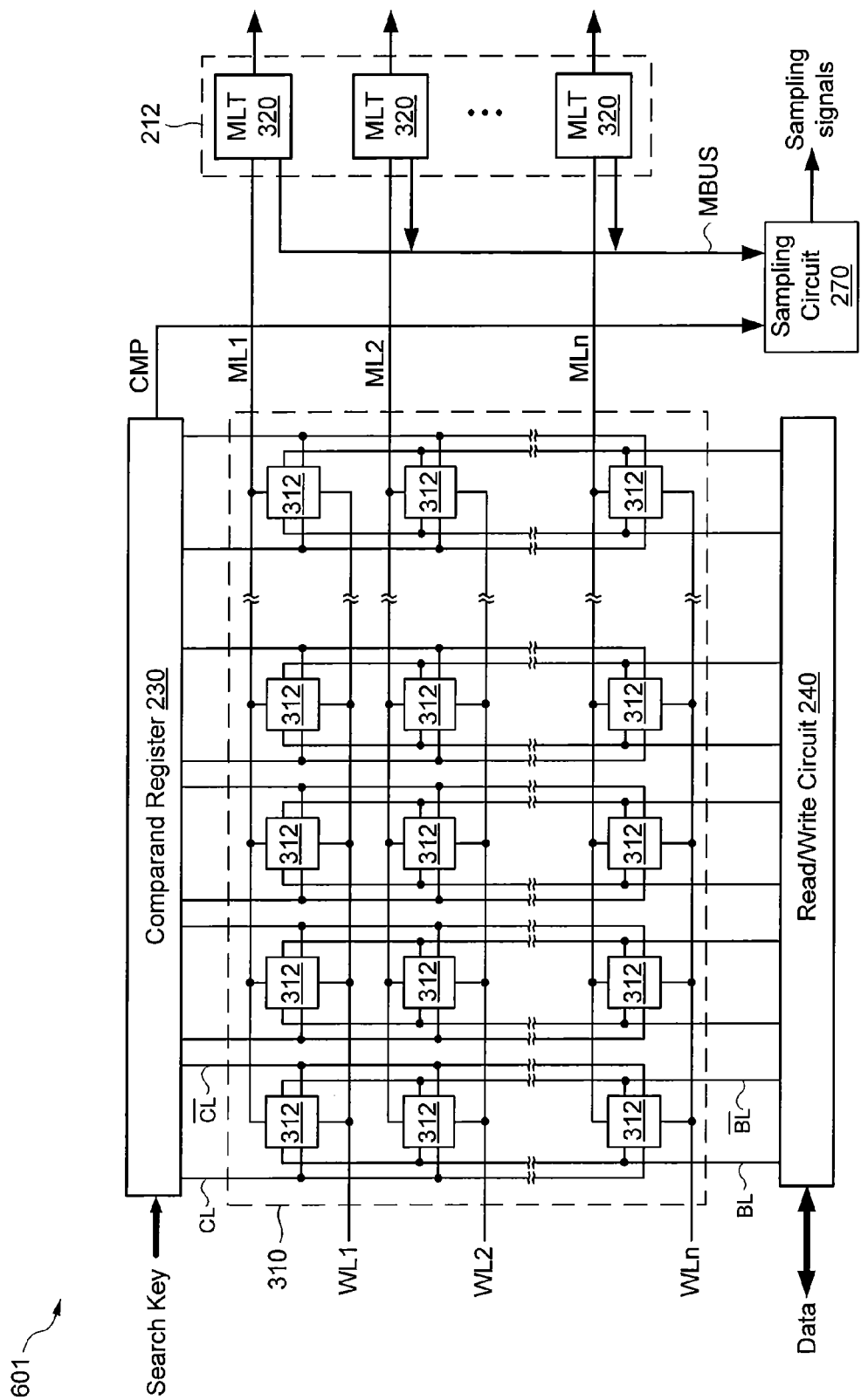
FIG. 6B is a block diagram of a portion of yet another embodiment of the CAM device of FIG. 2.

FIG. 6B shows CAM array 310 coupled to sampling circuit 270 in accordance with another embodiment. For the exemplary embodiment of FIG. 6B, each of match latches 320 includes a read port coupled to a match bus (MBUS) that can be used to provide match state information from match latches 320 to the first port of sampling circuit 270. For some embodiments, MBUS can be implemented as a complementary pair of match bit lines and the match latches 320 can be sequentially selected (e.g., using word lines WL, dedicated match latch word lines, or other suitable selection signals) for outputting match state information to the sampling circuit 270. In addition, the second port of sampling circuit 270 is coupled to receive the compare signal (CMP) from comparand register 230.

Figure 7:
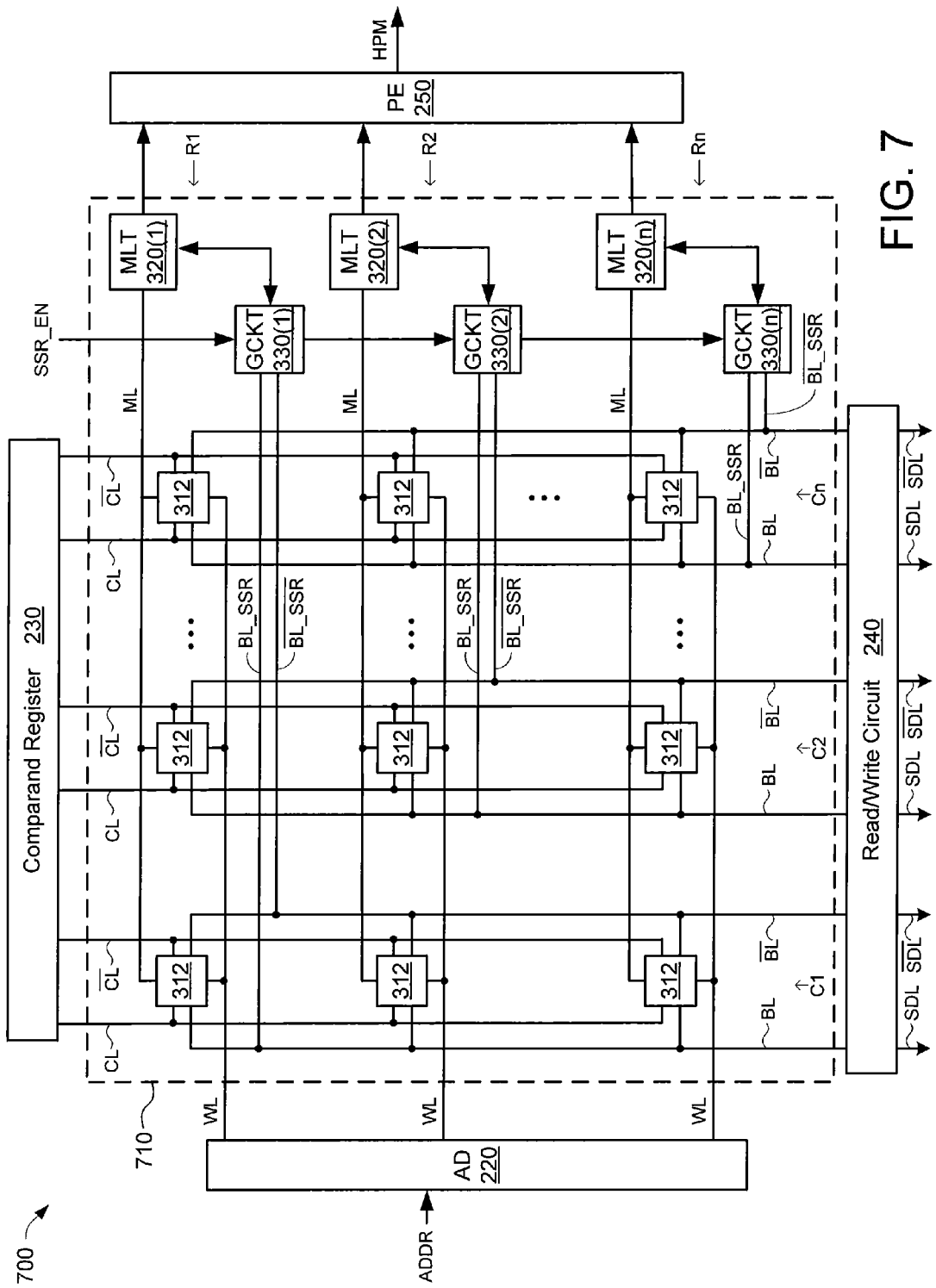
FIG. 7 is a block diagram of a portion of still another embodiment of the CAM device of FIG. 2.

For other embodiments, the state information stored in rows of the CAM array (e.g., in match latches 320) can be read from the array in parallel using the array's bit lines. For example, FIG. 7 shows a portion 700 of a CAM device that is one embodiment of the CAM device 200 of FIG. 2. CAM device 700 is shown to include a CAM array 710, address decoder 220, comparand register 230, read/write circuit 240, and priority encoder 250. CAM array 710, which is one embodiment of CAM array 210 of FIG. 2, includes a plurality of CAM cells 312 arranged in a number of rows (R1-Rn) and columns (C1-Cn), includes a number of match latches 320(1)-320(n), and includes a number of state information gating circuits 330(1)-330(n). For the exemplary embodiment of FIG. 7, CAM array 710 includes the same number of rows and columns. However, for other embodiments, CAM array 710 may include a greater number of rows than columns, as discussed below with respect to FIG. 12. The CAM cells 312 can be any suitable type of CAM cell including, for example, binary, ternary, and/or quaternary CAM cells.

Each row of CAM array 710 includes a plurality of CAM cells 312, a match latch 320, and a state information gating circuit 330. More specifically, each row of CAM cells 312 is coupled to address decoder 220 via a corresponding word line WL, and is coupled to an associated match latch 320 via a corresponding match line ML. The word lines are selectively driven by address decoder 220 in response to an address to select one or more of rows of CAM cells 312 for writing or reading in a well-known manner. The match lines ML indicate match results of a compare operation performed in CAM array 710. The match latches 320, which can be any suitable register, latch, flip-flop, SRAM cell, DRAM cell, or other memory element, store the match results provided on the match lines ML and provide the match results to priority encoder 250. Although not shown for simplicity, for some embodiments, each match latch 320 can include a clock input to receive a match latch signal that causes the match latches 320 to latch the match signals provided on the match lines ML.

Each column of CAM cells 312 is coupled to the comparand register 230 via a complementary comparand line pair CL/$\overline{CL}$, and to the read/write circuit 240 via a complementary bit line pair BL/$\overline{BL}$. The comparand register 230 includes a plurality of drivers (not shown for simplicity) that provide complementary comparand data to columns of CAM cells 312 during compare or search operations via the comparand line pairs CL/$\overline{CL}$. The read/write circuit 240 provides/receives complementary CAM data to/from the columns of CAM cells 312 via the bit line pairs BL/$\overline{BL}$. More specifically, read/write circuit 240 includes a plurality of well-known sense amplifiers (not shown for simplicity) to read data read from the bit line pairs BL/$\overline{BL}$, and includes a plurality of well-known write drivers (not shown for simplicity) to write data into the CAM array 710 via the bit line pairs BL/$\overline{BL}$. Read/write circuit 240 is coupled to the sampling circuit 270 (not shown in FIG. 7 for simplicity) via a number of state data line pairs SDL/$\overline{SDL}$, where each state data line pair is associated with the bit line pair BL/$\overline{BL}$ in a corresponding column of CAM array 710.

In accordance with the present embodiments, the state information gating circuit 330 in each CAM row includes a first port coupled to the match latch 320 in the row, and includes a second port coupled to the bit line pair of an associated column of the CAM array. More specifically, for each given CAM row, the gating circuit 330 is coupled to a data port of the match latch 320 in the given row, and is also coupled to the bit line pair BL/$\overline{BL}$ of the associated column by a corresponding save state and restore bit line pair BL_SSR/$\overline{BL\_SSR}$. For example, the gating circuit 330(1) in the first row (R1) of the array is coupled to the match latch 320(1) in the first row (R1) and is coupled to the bit line pair BL/$\overline{BL}$ in the first column (C1), the gating circuit 330(2) in the second row (R2) of the array is coupled to the match latch 320(2) in the second row (R2) and is coupled to the bit line pair BL/$\overline{BL}$ in the second column (C2), and so on, where the gating circuit 330($n$) in the $n^{th}$ row (Rn) of the array is coupled to the match latch 320($n$) in the $n^{th}$ row (Rn) and is coupled to the bit line pair BL/$\overline{BL}$ in the $n^{th}$ column (Cn).

Each of state information gating circuits 330(1)-330($n$) also includes a control input to receive a save state and restore enable signal SSR_EN that can be used to selectively couple the match latches 320(1)-320($n$) in respective rows R1-Rn to the bit line pairs BL/$\overline{BL}$ in respective columns C1-Cn. In this manner, the state information gating circuits 330 allow state information (e.g., match results) stored for rows of CAM array 310 to be transposed onto columns of the CAM array and then provided in parallel to the sampling circuit 270 (not shown in FIG. 7 for simplicity) using the CAM array's bit line pairs. More specifically, state information for rows R1-Rn that is stored in the match latches 320(1)-320($n$) can be simultaneously driven onto the bit line pairs BL/$\overline{BL}$ from the SSR bit line pairs BL_SSR/$\overline{BL\_SSR}$ by respective gating circuits 330(1)-330($n$) and thereafter read from the CAM array 710 in parallel by the sense amplifiers (not shown for simplicity) provided within read/write circuit 240, which in turn can output the state information in parallel from the CAM array 710 to the sampling circuit 270.

Figure 8:
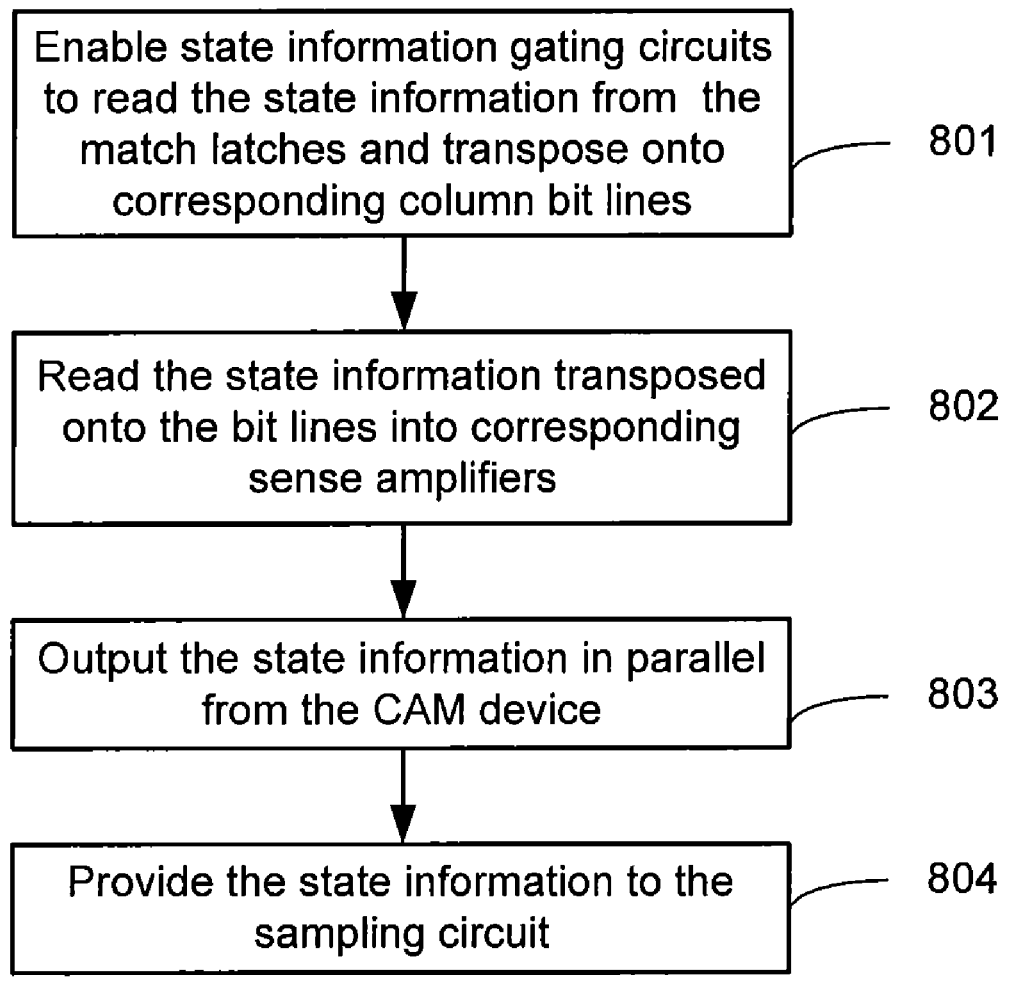
FIG. 8 is an illustrative flow chart depicting an exemplary operation for reading state information from the CAM array to the sampling circuit in accordance with some embodiments.

An exemplary operation for reading state information from the CAM array 710 into sampling circuit 270 is depicted in FIG. 8. First, the control signal SSR_EN is driven to a read state that allows gating circuits 330(1)-330($n$) to read the state information stored in the match latches 320(1)-320($n$) and transpose the state information in parallel onto the bit line pairs BL/$\overline{BL}$ in respective columns C1-Cn via corresponding signal line pairs BL_SSR/$\overline{BL\_SSR}$ (801). For some embodiments, the control signal SSR_EN can be driven to a read state by sampling control circuit 280 (see also FIG. 3). After being transposed onto the bit line pairs BL/$\overline{BL}$, the state information is then read in parallel by sense amplifiers within read/write circuit 240 (802). Next, read/write circuit 240 outputs the state information from the CAM array 710 to the sampling circuit 270 in parallel via state data line pairs SDL/$\overline{SDL}$ (803), and the state information is latched into the sampling circuit 270 (804).

Figure 9:
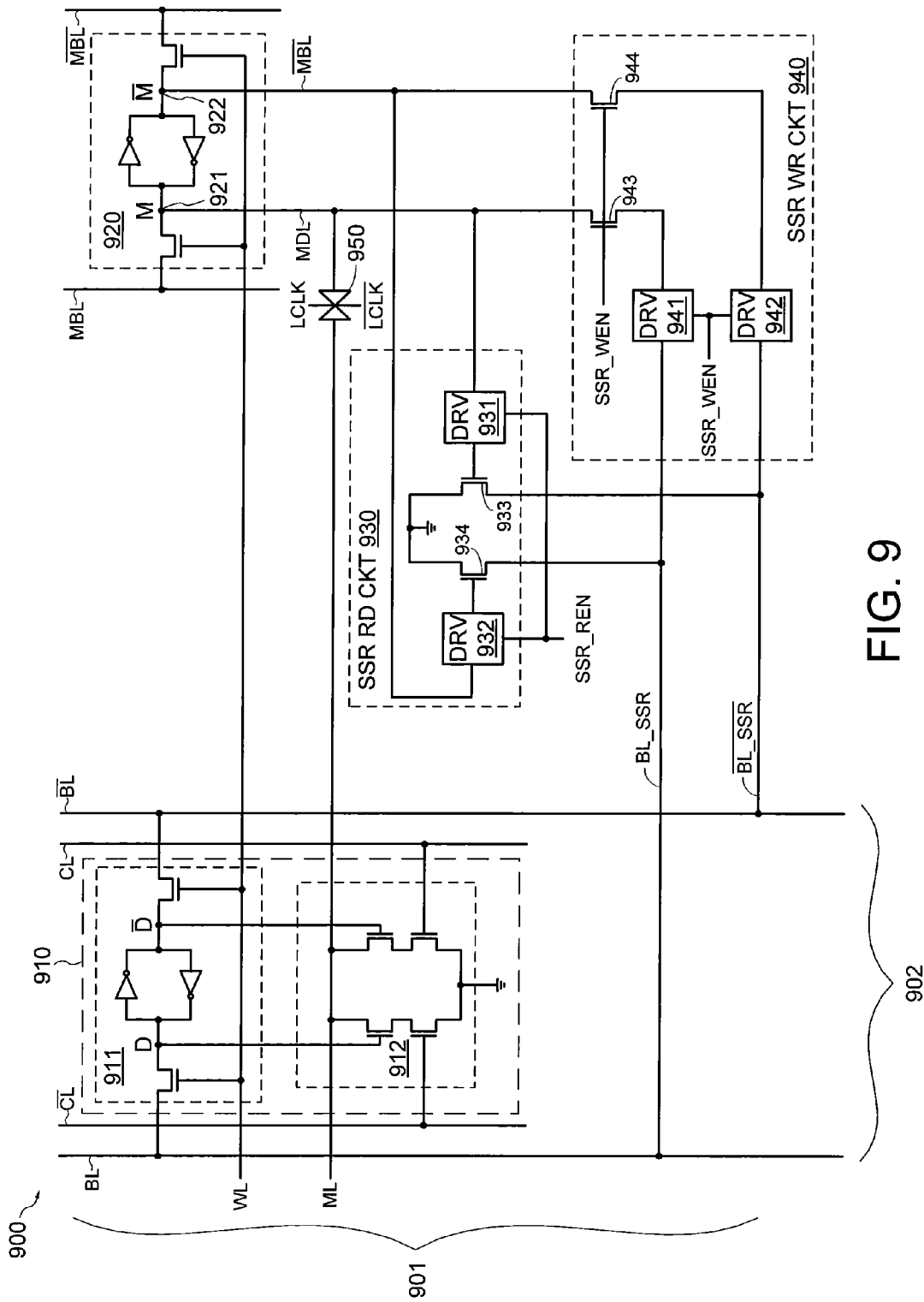
FIG. 9 is a circuit diagram of one embodiment of the CAM array of FIG. 7.

FIG. 9 shows a more detailed portion 900 of CAM array 710 in accordance with some embodiments. CAM portion 900 includes a row 901 and a column 902. The row 901 includes a binary CAM cell 910, a match latch 920, an SSR read circuit 930, an SSR write circuit 940, and a well-known pass gate 950. For simplicity, only one CAM cell 910 is shown in FIG. 9, although for actual embodiments, CAM row 901 and CAM column 902 can include any suitable number of CAM cells. Further, CAM cell 910 is depicted in FIG. 9 as a well-known binary CAM cell for simplicity. However, for actual embodiments, CAM cell 910 can be any suitable type of CAM cell including, for example, ternary and quaternary CAM cells.

As shown in FIG. 9, CAM cell 910 includes an SRAM cell 911 and a compare circuit 912. SRAM cell 911, which is well-known, is coupled to a complementary bit line pair BL/$\overline{BL}$ associated with corresponding column 902 of the CAM array, and is coupled to a word line associated with the corresponding row 901. As known in the art, a data bit D is written to SRAM cell 911 by asserting the word line high (e.g., to VDD) and driving a value of D and its complement $\overline{D}$ on BL and $\overline{BL}$, respectively. Compare circuit 912, which is well-known, is coupled to SRAM cell 911, to a match line ML for the row 901, and to a complementary comparand line pair CL/$\overline{CL}$ associated with the corresponding column 902. Compare circuit 912 compares a comparand bit (e.g., a bit of the search key) with the data bit D stored in the cell 911, and indicates the match results on the match line ML. The match results on ML are provided to and stored in the match latch 920.

Match latch 920, which is one embodiment of match latch 320 of FIG. 3, is shown in FIG. 9 as a well-known SRAM cell that stores a match bit M and its complement $\overline{M}$ at nodes 921 and 922, respectively. Match latch 920 is coupled to the word line WL and coupled to a match bit line pair MBL/$\overline{MBL}$ to enable testing functions, as well as to enable conventional serial read and write operations. Node 921 is selectively coupled to the row's match line ML by pass gate 950 in response to a latch clock signal LCLK, where LCLK and its complement $\overline{LCLK}$ are provided to complementary control terminals of pass gate 950. In this manner, during compare operations, the data node 921 of match latch 920 is driven to the logic state indicated on the match line ML by pass gate 950, which causes the complementary data node 922 of match latch 920 to be driven to the complementary logic state. Although not shown for simplicity, for some embodiments, a suitable well-known gating circuit can be provided on the match line ML selectively de-couple the CAM cells 910 from the match latch 920 (e.g., during ML pre-charging operations).

In accordance with present embodiments, the match latch 920 in row 901 is coupled to the bit line pair BL/$\overline{BL}$ of column 902 via SSR bit line pair BL_SSR/$\overline{BL\_SSR}$ so that state information can be read from match latch 920 to sampling circuit 270 (not shown in FIG. 9 for simplicity) using the column's bit line pair. As described in more detail below, read operations from match latch 920 to the bit line pair BL/$\overline{BL}$ are facilitated by SSR read circuit 930 in response to an SSR read enable signal SSR_REN, and write operations (e.g., from an external device) from the bit line pair BL/$\overline{BL}$ to match latch 920 are facilitated by SSR write circuit 940 in response to an SSR write enable signal SSR_WEN. Together, SSR read circuit 930 and SSR write circuit 940 form one embodiment of state information gating circuits 330 of FIG. 7, and enable signals SSR_REN and SSR_WEN form one embodiment of control signal SSR_EN of FIG. 7.

More specifically, SSR read circuit 930 includes driver circuits 931-932 and NMOS transistors 933-934. NMOS transistor 933 is coupled between $\overline{BL\_SSR}$ and ground potential, and has a gate selectively coupled to data node 921 of match latch 920 by driver circuit 931 in response to SSR_REN. NMOS transistor 934 is coupled between BL_SSR and ground potential, and has a gate selectively coupled to complementary data node 922 of match latch 920 by driver circuit 932 in response to SSR_REN. To read state information from match latch 920 to the sampling circuit 270 via bit line pair BL/$\overline{BL}$, the word line WL is de-asserted (e.g., to logic low) to isolate data stored in CAM cell 910 from the bit lines BL and $\overline{BL}$ during the read state information operation, the bit lines BL and $\overline{BL}$ are pre-charged (e.g., toward VDD), and SSR_REN is asserted (e.g., to logic high) to turn on driver circuits 931-932. Driver circuits 931 and 932 drive the gates of corresponding transistors 933 and 934 with the match bit M and the complementary match bit $\overline{M}$, respectively. In response thereto, transistors 933 and 934 pull respective signal lines $\overline{BL\_SSR}$ and BL_SSR to opposite logic states, which in turn drive respective signal lines $\overline{BL}$ and BL to opposite logic states to achieve a differential voltage indicative of the state information stored in the match latch 920. In this manner, the state information is transposed from row 901 of the CAM array to column 902 of the CAM array, thereby facilitating the parallel reading of state information from a number N of rows to the sampling circuit 270 via a corresponding number N of columns.

For example, if M=1 and $\overline{M}$=0, then driver circuit 931 drives the gate of transistor 933 to logic high (e.g., toward VDD) and driver circuit 932 drives the gate of transistor 934 to logic low (e.g., toward ground potential). In response thereto, transistor 933 turns on and pulls $\overline{BL\_SSR}$ and $\overline{BL}$ to logic low, and transistor 934 turns off and does not discharge BL_SSR or BL. In this manner, BL remains in its pre-charged logic high state and $\overline{BL}$ is discharged to logic low, thereby creating a differential voltage between BL and $\overline{BL}$ representative of the M=1 value stored in the match latch 920. Conversely, if M=0 and $\overline{M}$=1, then driver circuit 931 drives the gate of transistor 933 to logic low and driver circuit 932 drives the gate of transistor 934 to logic high. In response thereto, transistor 933 turns off and does not discharge $\overline{BL\_SSR}$ or $\overline{BL}$, and transistor 934 turns on and discharges BL_SSR and BL. In this manner, BL is discharged to logic low and $\overline{BL}$ remains in its pre-charged logic high state, thereby creating a differential voltage between BL and $\overline{BL}$ representative of the M=0 value stored in the match latch 920.

SSR write circuit 940 includes driver circuits 941-942 and NMOS transistors 943-944. NMOS transistor 943 is selectively coupled between BL_SSR and data node 921 of match latch 920 by driver circuit 941 in response to SSR_WEN. NMOS transistor 944 is selectively coupled between $\overline{BL\_SSR}$ and complementary data node 922 of match latch 920 by driver circuit 942 in response to SSR_WEN. To write state information from an external device to the match latch 920 via bit line pair BL/$\overline{BL}$, the word line WL is de-asserted (e.g., to logic low) to isolate data stored in CAM cell 910 from the bit lines BL and $\overline{BL}$ during the write state information operation, the bit lines BL and $\overline{BL}$ are driven to a differential voltage indicative of the match value M to be written to match latch 920 by read/write circuit 240, and SSR_WEN is asserted (e.g., to logic high) to turn on driver circuits 941-942 and to turn on NMOS transistors 943-944. Thereafter, driver circuit 941 drives the logic value provided on BL to data node 921 of match latch 920 via BL_SSR, and driver circuit 942 drives the logic value provided on $\overline{BL}$ to complementary data node 922 of match latch 920 via $\overline{BL\_SSR}$.

Note that when SSR read circuit 930 is not being used to transfer state information from match latch 920 to the external memory via the array's bit lines, the signal SSR_REN is de-asserted to isolate match latch 920 from the bit lines. Similarly, when SSR write circuit 940 is not being used to transfer state information to match latch 920 from the external memory via the array's bit lines, the signal SSR_WEN is de-asserted to isolate match latch 920 from the bit lines.

Figure 10A:
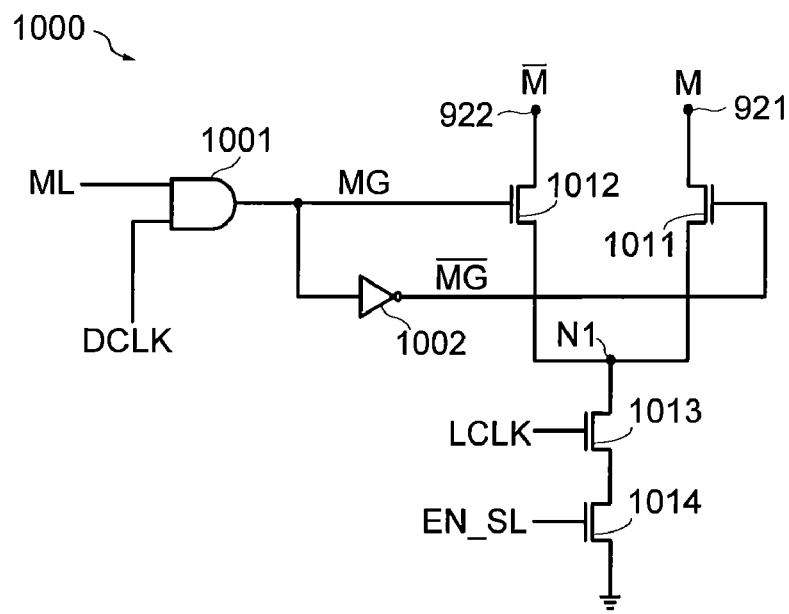
FIG. 10A shows a circuit diagram of one embodiment of the pass gate of FIG. 9.

FIG. 10A shows a pass gate 1000 that is one embodiment of pass gate 950 of FIG. 9. Pass gate 1000 includes an AND gate 1001, a CMOS inverter 1002, and NMOS transistors 1011-1014. Referring also to FIG. 9, the AND gate 1001 includes a first input coupled to the match line ML, a second input to receive a data clock signal DCLK, and an output to generate a gated match signal MG. Transistor 1012 is coupled between node 922 of match latch 920 and an intermediate pass gate node N1, and has a gate to receive the gated match signal MG. Transistor 1011 is coupled between node 921 of match latch 920 and intermediate pass gate node N1, and has a gate to receive a complemented gated match signal $\overline{MG}$ generated in response to MG by the CMOS inverter 1002. Transistors 1013 and 1014 are coupled between intermediate node N1 and ground potential, and have gates to receive LCLK and a state latch enable signal EN_SL, respectively. For other embodiments, transistor 1014 can be omitted.

Pass gate 1000 transfers the match signal on the match line ML to the match latch 920 as follows. Prior to compare operations in row 900, DCLK is de-asserted, which causes AND gate 1001 to isolate the match line ML from the match latch 920. Further, LCLK and EN_SL are de-asserted to turn off respective transistors 1013 and 1014, thereby isolating the match latch 920 from ground potential. Once the match results are generated on the match line ML, DCLK is asserted to enable the AND gate 1001 to output the match signal on ML as the gated match signal MG, and LCLK and EN_SL are asserted to turn on transistors 1013 and 1014. For example, if the match signal is logic high (e.g., indicating a match condition), the AND gate 1001 drives MG to logic high, and in response thereto CMOS inverter 1002 drives $\overline{MG}$ to logic low. The logic high state of MG turns on transistor 1012, which in turn pulls node 922 of match latch 920 low toward ground potential through transistors 1013 and 1014. In this manner, $\overline{M}$ is driven to logic low, which in turn drives node 921 to logic high, thereby storing M=1 in the match latch. The logic low state of $\overline{MG}$ turns off transistor 1011 and isolates node 921 of the match latch 920 from ground potential. Conversely, if the match signal is logic low (e.g., indicating a mismatch condition), the AND gate 1001 drives MG to logic low, and in response thereto CMOS inverter 1002 drives $\overline{MG}$ to logic high. The logic high state of $\overline{MG}$ turns on transistor 1011, which in turn pulls node 921 of match latch 920 low toward ground potential through transistors 1013 and 1014. In this manner, M is driven to logic low, which in turn drives node 922 to logic high, thereby storing M=0 in the match latch. The logic low state of MG turns off transistor 1012 and isolates node 922 of the match latch 920 from ground potential.

Figure 10B:
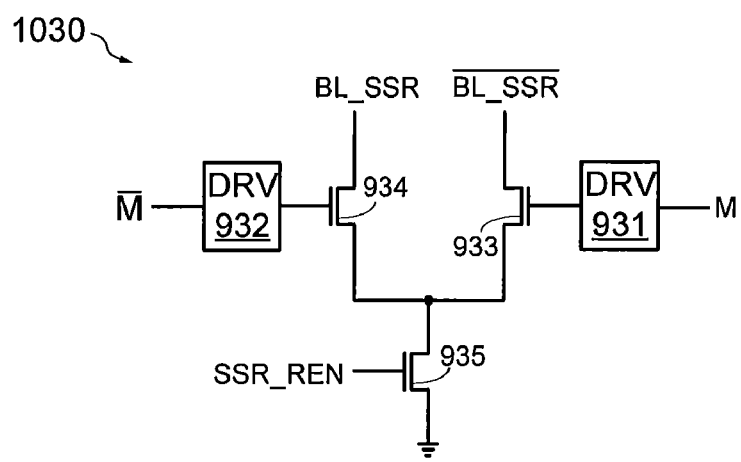
FIG. 10B shows another embodiment of the save state and restore read circuit of FIG. 9.

FIG. 10B shows an SSR read circuit 1030 that is another embodiment of SSR read circuit 930 of FIG. 9. SSR read circuit 1030 includes all the elements of SSR read circuit 930, and an additional NMOS transistor 935 coupled between the drains of NMOS transistors 933-934 and ground potential. Transistor 935, which has a gate to receive the control signal SSR_REN, provides isolation between 933-934 and ground potential.

Figure 11A:
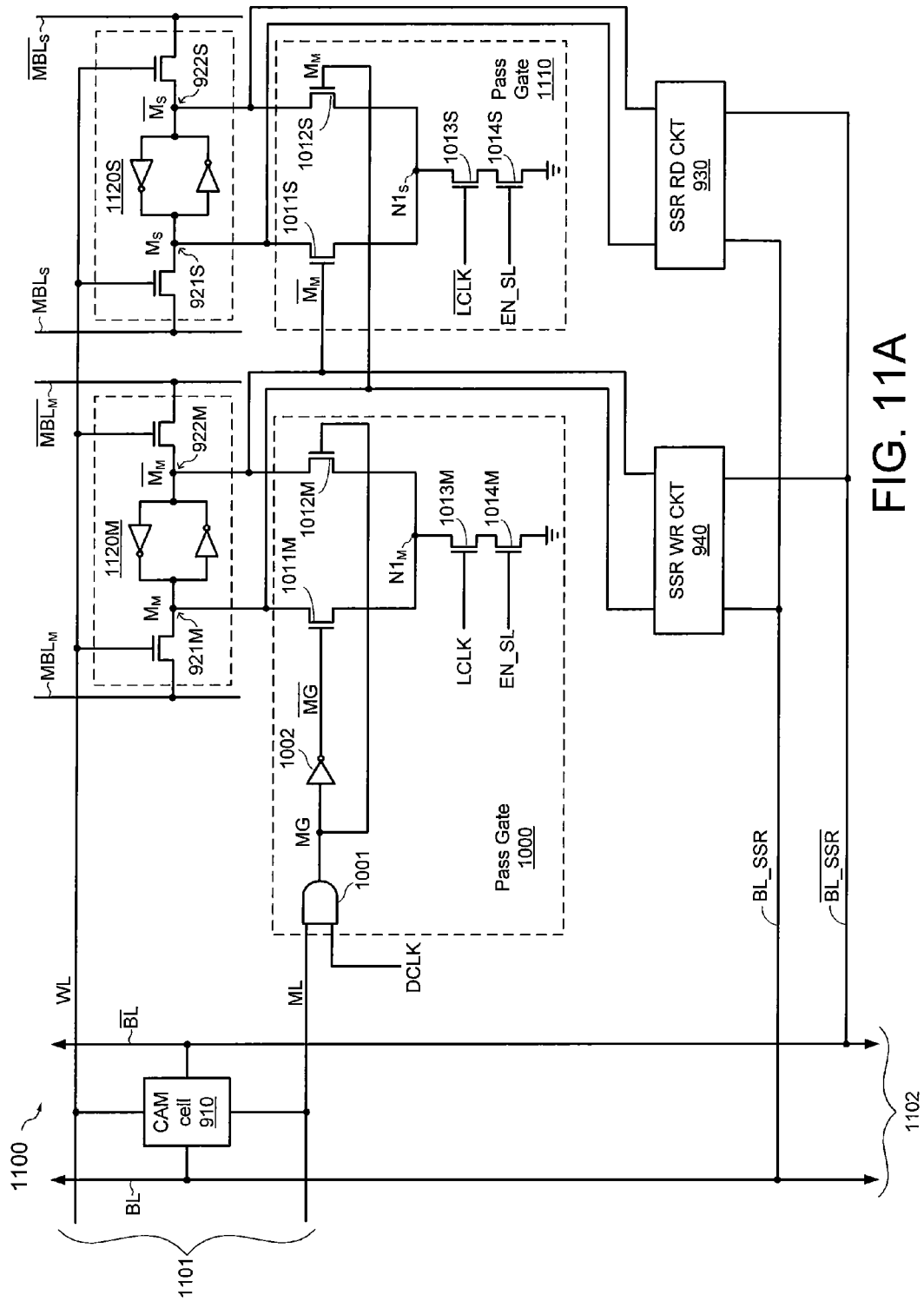
FIG. 11A shows a circuit diagram of a portion of another embodiment of the CAM array of FIG. 7.

FIG. 11A shows a more detailed portion 1100 of CAM array 710 in accordance with some embodiments. CAM portion 1100 includes a row 1101 and a column 1102. The row 1101 includes CAM cell 910, a master match latch 1120M, a slave match latch 1120S, SSR read circuit 930, SSR write circuit 940, and pass gate 1000 (see also FIG. 10A). CAM row 1101 is similar to CAM row 901 of FIG. 9, except that match latch 920 is replaced by master/slave match latches 1120M and 1120S, which together form a flip-flop that is another embodiment of match latch 920 of FIG. 9. The flip-flop can store the match results for the corresponding CAM row for a full clock cycle (e.g., as opposed to a single latch that stores the results for only one phase of the clock signal), and therefore the match latches discussed above with respect to the exemplary embodiments FIGS. 7 and 9 are typically implemented as flip-flops in the manner depicted in FIG. 11A. Master match latch 1120M stores a master match bit $M_M$ at its node 921M and stores the complement $\overline{M_M}$ at its node 922M, and slave match latch 1120S stores a slave match bit $M_S$ at its node 921S and the complement $\overline{M_S}$ at its node 922S. In this manner, the master match latch 1120M stores the initial match state information, and the slave match latch 1120S stores the final match state information.

The individual configuration and operation of master match latch 1120M and slave match latch 1120S are similar to that described above with respect to match latch 920 of FIG. 9, except that master match latch 1120M is connected directly to SSR write circuit 940, and slave match latch 1120S is connected directly to SSR read circuit 930. As a result, state information can be restored from an external device to master match latch 1120M via SSR write circuit 940, and state information can be saved or read to an external device (e.g., such as sampling circuit 270) from slave match latch 1120S via SSR read circuit 930, as described in more detail below.

For simplicity, only one CAM cell 910 is shown in FIG. 11A, although for actual embodiments, CAM row 1101 and CAM column 1102 can include any suitable number of CAM cells. As mentioned above with respect to FIG. 9, CAM cell 910 can be any suitable type of CAM cell including, for example, binary, ternary and/or quaternary CAM cell.

As shown in FIG. 11A, the master match latch 1120M is coupled to the pass gate 1000 in the manner described above with respect to FIG. 10A, and is also coupled to the slave match latch 1120S. More specifically, node 921M of master match latch 1120M is coupled to the gate of transistor 1012S, and node 922M of master match latch 1120M is coupled to the gate of transistor 1011S so that the match bit $M_M$ stored in the master match latch 1120M can be transferred to and stored in the slave match latch 1120S as $\overline{M_S}$ in response to the complemented latch clock signal $\overline{LCLK}$ provided to the gate of transistor 1013S. Together, transistors 1011S-1014S form a pass gate 1110 that selectively transfers the match data $M_M$ stored in the master match latch 1120M to the slave match latch 1120S in response to $\overline{LCLK}$.

During compare operations, the match results generated on the match line ML are first driven into the master match latch 1120M during a first phase of LCLK, and are then transferred to the slave match latch 1120S during a second phase of LCLK. More specifically, after match results are generated on the match line ML in response to compare operations in the CAM cells 910, DCLK is asserted and allows pass gate 1000 to drive the resulting match signal on the match line ML as the match bit $M_M$ into master match latch 1120M in response to a triggering edge of LCLK (e.g., in the manner described above with respect to FIG. 10A). Then, in response to the triggering edge of $\overline{LCLK}$, which for some embodiments is 180 degrees out of phase with respect to LCLK, transistor 1013S turns on and allows the match bit $M_M$ stored in master match latch 1120M to be driven into the slave match latch 1120S as the match bit $M_S$, thereby transferring the match bit from the master match latch 1120M to the slave match latch 1120S one-half cycle after the match results are stored in the master match latch 1120M.

Then, during flow switch operations, the master match latch 1120M and the slave match latch 1120S can be separately used to write state information into the CAM row 1101 and to read state information from the CAM row 1101, respectively. More specifically, to read state information from CAM row 1101 to an external device such as sampling circuit 270, the complementary match bits $M_S$ and Ms are provided from slave match latch 1120S to SSR read circuit 930, which in turn drives the match bit onto the bit line pair BL/$\overline{BL}$ via the SSR bit line pair BL_SSR/$\overline{BL\_SSR}$ in response to SSR_REN, as described above with respect to FIG. 9. To restore state information from the external device to the CAM row 1101, the bit lines BL and $\overline{BL}$ are driven to a differential voltage indicative of the externally stored match value M by read/write circuit 240, and SSR_WEN is asserted to enable SSR write circuit 940 to write the match value received from the bit line pair BL/$\overline{BL}$ via the SSR bit line pair BL_SSR/$\overline{BL\_SSR}$ to the master match latch 1120M.

Figure 11B:
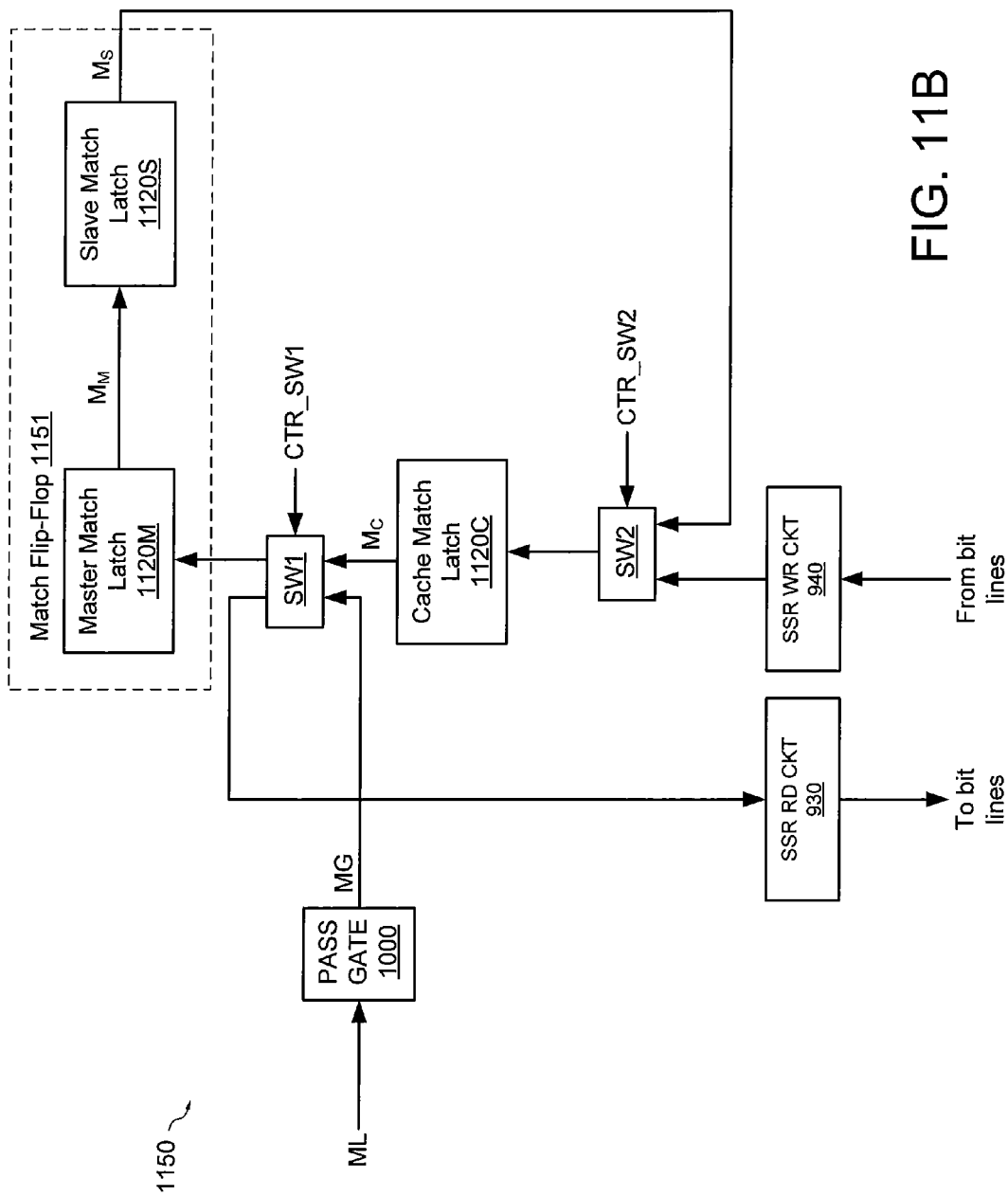
FIG. 11B shows a functional block diagram of a portion of yet another embodiment of the CAM array of FIG. 7.

For another embodiment, an additional latch (e.g., SRAM cell) can be added to each CAM row and used as a cache memory to facilitate the transfer of state information between the CAM array and the external device in a manner that virtually eliminates array down-time associated with flow switch operations. For example, FIG. 11B shows a simplified functional block diagram of a portion 1150 of a CAM row that is a modified embodiment of CAM row 1101 of FIG. 11A. CAM row 1150 is shown to include pass gate 1000, SSR read circuit 930, SSR write circuit 940, master match latch 1120M, and slave match latch 1120S of CAM row 1101, and additionally includes a cache match latch 1120C and switches SW1-SW2. Together, master match latch 1120M and slave match latch 1120S form a match flip-flop 1151. Pass gate 1000 has an input to receive the match results from the match line ML, and includes an output to provide the gated match signal MG to a first input of switch SW1, which includes a second input to receive a cached match signal $M_C$ from cache match latch 1120C, a first output coupled to master match latch 1120M, a second output coupled to SSR read circuit 930, and a control terminal to receive a corresponding first switch control signal CTR_SW1. The output of master match latch 1120M provides the latched match bit $M_M$ to slave match latch 1120S, which in turn has an output coupled to a first input of switch SW2. The second switch SW2 includes a second coupled to the output of SSR write circuit 940, an output coupled to an input of cache match latch 1120C, and a control terminal to receive a corresponding second switch control signal CTR_SW2. For simplicity, the CAM cell 910, bit line pairs, and SSR bit line pair associated with row 1150 are not shown in FIG. 11B.

As mentioned above, the exemplary CAM array 710 depicted in FIG. 7 includes the same number of rows and columns, and therefore there is a one-to-one correspondence between the bit line pairs BL/$\overline{BL}$ in columns of the array and the SSR bit line pairs BL_SSR/$\overline{BL\_SSR}$ in rows of the array that allows state information stored in rows of the CAM array (e.g., in match latches 320(1)-320(n)) to be simultaneously transposed onto columns of the CAM array and read from the array via the bit line pairs BL/$\overline{BL}$ in parallel in a single operation. However, actual embodiments of CAM array 210 of FIG. 2 typically a much greater number of rows than columns. For such embodiments, the bit line pair BL/$\overline{BL}$ in each column is selectively coupled to a plurality of different rows via gating circuits 330 so that match information can be transferred to the sampling circuit 270 and a number Z of row groups in Z successive operations. For example, in one exemplary embodiment of CAM array 210 that includes X=256 rows and Y=64 columns, the rows of the array are grouped into Z=X/Y=4 groups of 64 rows. Within each row group, each of the 64 rows is coupled to a corresponding one of the 64 columns via the SSR bit lines and gating circuits 330. During save state and restore operations, data is transferred in parallel between the external state memory and a selected group of 64 rows using the bit lines corresponding to the 64 columns.

Figure 12:
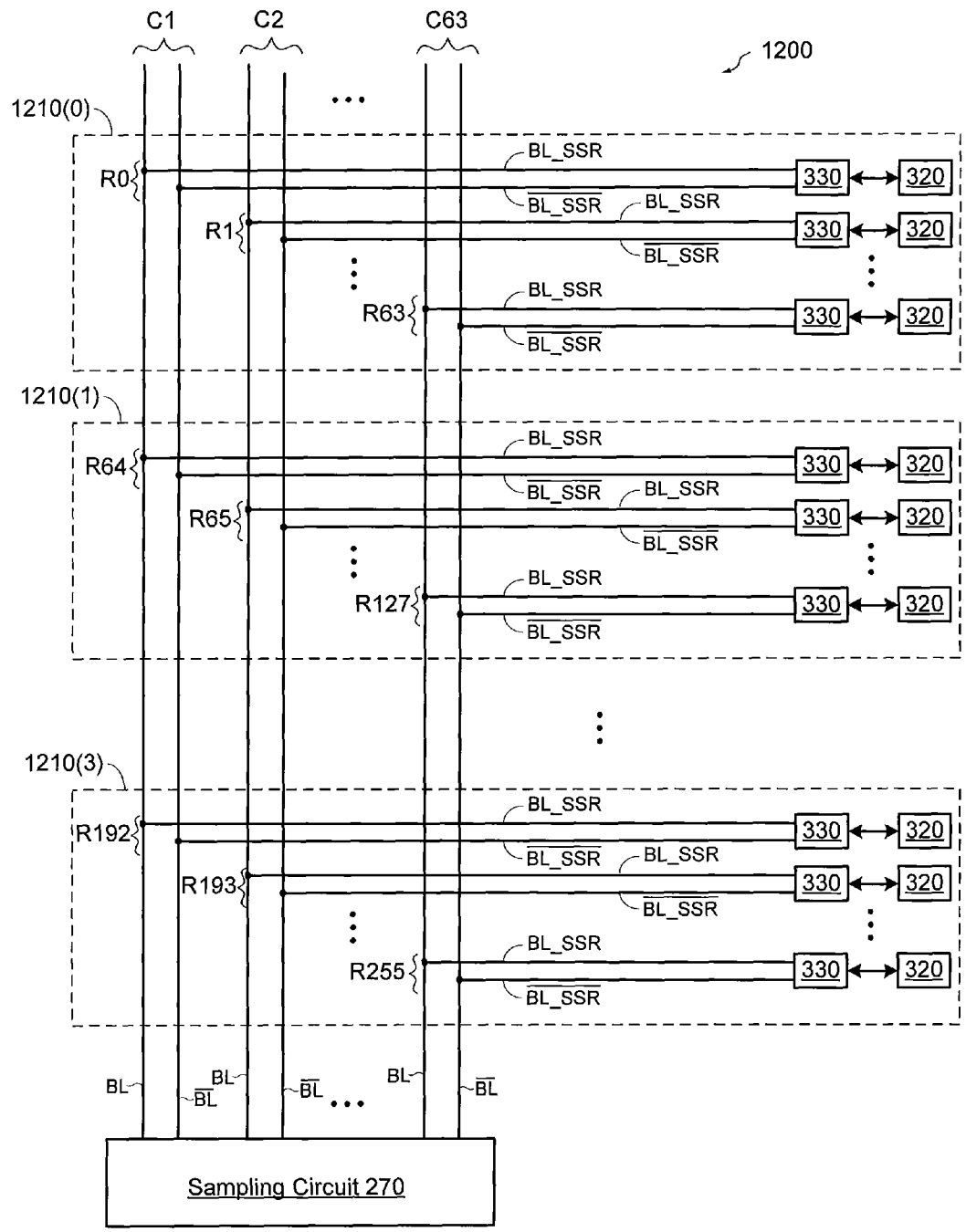
FIG. 12 shows a simplified block diagram of another embodiment of the CAM array of FIG. 3.

FIG. 12 depicts the multiplexed interconnections between the rows and columns of such an exemplary embodiment. CAM block 1200, which is one embodiment of CAM array 210 of FIG. 2, includes X=256 rows R0-R255 and Y=64 columns C0-C63, wherein the rows are grouped into Z=X/Y=256/64=4 row groups 1210(0)-1220(3). Thus, the first row group 1210(0) includes the first 64 rows R0-R63, the second row group 1210(1) includes the second 64 rows R64-R127, and so on, where the last row group 1210(3) includes the last 64 rows R192-R255. For simplicity, the CAM cells, word lines WL, comparand lines CL, match lines ML, comparand register 230, and read/write circuit 240 are not shown in FIG. 12. For the exemplary embodiment of FIG. 12, state information can be transferred from CAM block 1200 and to the sampling circuit 270 in 4 transfer cycles, where each transfer cycle facilitates the parallel transfer of state information to the sampling circuit 270 from the 64 rows of a corresponding row group 1210 via the bit line pairs in the 64 columns C0-C63. Each of row groups 1210(0)-1210(3) can be selected for state information transfers by selectively asserting the SSR enable signals (e.g., SSR_WEN and SSR_REN) provided to the gating circuits within the row group. For some embodiments, the SSR enable signals can be multiplexed to selectively enable state information transfers for each row group 1210.

While particular embodiments have been shown and described, it will be obvious to those skilled in the art that changes and modifications may be made without departing from this disclosure in its broader aspects and, therefore, the appended claims are to encompass within their scope all such changes and modifications as fall within the true spirit and scope of this disclosure. Further, it should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages.

What is claimed is:

1. A search system including a content addressable memory (CAM) device, comprising:
   a CAM array having a plurality of rows, each row including a number of CAM cells coupled to a match latch, the match latch to store match signals generated during compare operations;
   a sampling circuit, coupled to the CAM array, to generate sampling signals indicating how many of the match signals are asserted during a sampling period; and
   an accumulator circuit to generate an estimated power profile signal in response to the sampling signals, wherein the estimated power profile signal indicates a time-averaged power profile of the CAM array.

2. The search system of claim 1, wherein the accumulator circuit is configured to logically combine the sampling signals during the sampling period to generate the estimated power profile signal.

3. The search system of claim 1, further comprising:
   a compare circuit to compare the estimated power profile signal with one or more reference values to generate a dynamic power control signal.

4. The search system of claim 3, further comprising:
   a throttle control circuit to selectively adjust an input data rate at which an input string is provided to the CAM array in response to the dynamic power control signal.

5. The search system of claim 4, wherein the throttle control circuit is configured to decrease the input data rate if the dynamic power control signal exceeds a selected one of the one or more reference values.

6. The search system of claim 5, wherein the throttle control circuit is configured to decrease the input data rate until the dynamic power control signal falls below the selected reference value.

7. The search system of claim 5, wherein the throttle control circuit is configured to increase the input data rate after the dynamic power control signal falls below the selected reference value.

8. The search system of claim 5, wherein the selected reference value corresponds to a predicted temperature increase of the CAM device resulting from power consumption.

9. The search system of claim 3, wherein the compare circuit comprises:
   a look-up table having an input to receive the estimated power profile signal and having a plurality of locations for storing a plurality of different reference values; and
   a memory element coupled to the look-up table and having a plurality of locations for storing a plurality of different values of the dynamic power control signal.

10. The search system of claim 3, further comprising:
    a pipeline coupled to the accumulator circuit and including a plurality of serially connected register stages, wherein each register stage includes an output to provide the estimated power profile signal for a corresponding time period; and
    a summing circuit to combine the estimated power profile signals.

11. The search system of claim 1, wherein the sampling signals further indicate the number compare operations performed during the sampling period.

12. The search system of claim 1, wherein the sampling circuit comprises:
    a first counter circuit having an input port to receive the match signals from the match latches, the first counter circuit being configured to add the match signals to determine the number of match signals asserted during the sampling period; and
    a second counter circuit having an input port to receive a compare enable signal, the second counter circuit being configured to count the number of compare operations performed during the sampling period.

13. A content addressable memory (CAM) device, comprising:
    a CAM array having a plurality of rows, each row including a number of CAM cells coupled to a match latch, the match latch to store match signals generated during compare operations;
    a sampling circuit, coupled to the CAM array, to generate sampling signals indicating how many of the match signals are asserted during a sampling period; and
    a power estimator circuit to generate a dynamic power control signal in response to the sampling signals, wherein the dynamic power control signal corresponds to a time-averaged power profile of the CAM array.

14. The CAM device of claim 13, further comprising:
    a throttle control circuit, coupled to the CAM array, to selectively adjust an input data rate at which an input string is provided to the CAM array in response to the dynamic power control signal.

15. The CAM device of claim 14, wherein the throttle control circuit is configured to decrease the input data rate if the dynamic power control signal exceeds a reference value.

16. The CAM device of claim 15, wherein the throttle control circuit is configured to decrease the input data rate until the dynamic power control signal falls below the reference value.

17. The CAM device of claim 15, wherein the throttle control circuit is configured to increase the input data rate after the dynamic power control signal falls below the reference value.

18. The CAM device of claim 15, wherein the reference value corresponds to a predicted temperature increase of the CAM device resulting from power consumption.

19. The CAM device of claim 13, wherein the sampling signals further indicate the number compare operations performed during the sampling period.

20. The CAM device of claim 13, wherein the sampling circuit comprises:
a first counter circuit having an input port to receive the match signals from the match latches, the first counter circuit being configured to add the match signals to determine the number of asserted match signals during the sampling period; and
a second counter circuit having an input port to receive a compare enable signal, the second counter circuit being configured to count the number of compare operations performed during the sampling period.

21. The CAM device of claim 13, wherein the power estimator circuit comprises:
an accumulator circuit having an input to receiving the sampling signals and having an output to generate an estimated power profile signal; and
a compare circuit to compare the estimated power profile signal with one or more reference values to generate the dynamic power control signal.

22. The CAM device of claim 21, wherein the compare circuit comprises:
a look-up table having an input to receive the estimated power profile signal and having a plurality of locations for storing a plurality of different reference values; and
a memory element coupled to the look-up table and having a plurality of locations for storing a plurality of different values of the dynamic power control signal.

23. The CAM device of claim 21, wherein the power estimator circuit further comprises:
a pipeline coupled to the accumulator circuit and including a plurality of serially connected register stages, wherein each register stage includes an output to provide the estimated power profile signal for a corresponding time period; and
a summing circuit to combine the estimated power profile signals.

24. The CAM device of claim 13, wherein the power estimator circuit comprises:
an accumulator circuit having an input to receiving the sampling signals and having an output to generate an estimated power profile signal; and
a translator circuit to multiply the estimated power profile signal with a predetermined throttle factor to generate the dynamic power control signal.

25. A method of dynamically adjusting power consumption of a content addressable memory (CAM) device, comprising:
generating match signals during compare operations performed in the CAM device;
sampling the match signals to generate sampling signals indicating how many of the match signals are asserted during a sampling period; and
generating an estimated power profile signal in response to the sampling signals, wherein the estimated power profile signal indicates a time-averaged power profile of the CAM device.

26. The method of claim 25, further comprising:
selectively adjusting an input data rate at which an input string is provided to the CAM device in response to the estimated power profile signal.

27. The method of claim 26, wherein selectively adjusting the input data rate comprises:
comparing the estimated power profile signal to a reference value; and
decreasing the input data rate when the estimated power profile signal exceeds the reference value.

28. The method of claim 27, further comprising:
increasing the input data rate when the dynamic power control signal falls below the reference value.

29. The method of claim 27, wherein the reference value corresponds to a predicted increase in operating temperature resulting from power consumption of the CAM device.

30. The method of claim 26, wherein selectively adjusting the input data comprises:
comparing the estimated power profile signal to a number of reference values;
selecting a corresponding one of a number of power control signals in response to the comparing; and
selectively decreasing the input data rate in response to the selected power control signal.

31. The method of claim 25, wherein the number of match signals asserted during the sampling period is indicative of the power consumption of the CAM device.

32. The method of claim 25, wherein the sampling signals further indicate the number of compare operations performed during the sampling period.

33. The method of claim 32, wherein the estimated power profile signal (EPP) is expressed as EPP=(S*C)/T, where S is the number of match signals asserted during the sampling period, C is the number of compare operations performed during the sampling period, and T is the time duration of the sampling period.

34. The method of claim 25, wherein the sampling signals further indicate the number of clock signals elapsed during the sampling period.

* * * * *